United States Patent
Hisano et al.

(10) Patent No.: US 11,075,658 B2
(45) Date of Patent: Jul. 27, 2021

(54) MULTILAYER SUBSTRATE, FILTER, MULTIPLEXER, RADIO-FREQUENCY FRONT-END CIRCUIT, AND COMMUNICATION DEVICE

(71) Applicant: Murata Manufacturing Co., Ltd., Kyoto (JP)

(72) Inventors: Taizo Hisano, Kyoto (JP); Hideki Tsukamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/989,203

(22) Filed: Aug. 10, 2020

(65) Prior Publication Data

US 2020/0373949 A1 Nov. 26, 2020

Related U.S. Application Data

(63) Continuation of application No. PCT/JP2019/005868, filed on Feb. 18, 2019.

(30) Foreign Application Priority Data

Feb. 19, 2018 (JP) .............................. JP2018-027444

(51) Int. Cl.
*H05K 1/00* (2006.01)
*H04B 1/04* (2006.01)
(Continued)

(52) U.S. Cl.
CPC ............... *H04B 1/04* (2013.01); *H03H 7/461* (2013.01); *H03H 7/466* (2013.01); *H04B 1/1607* (2013.01); *H04B 2001/0408* (2013.01)

(58) Field of Classification Search
CPC ..................................................... H05K 1/162
See application file for complete search history.

(56) References Cited

U.S. PATENT DOCUMENTS 6,429,753 B1* 8/2002 Tsuru ...................... H01P 1/203
333/134
2001/0035798 A1* 11/2001 Jodo .......................... H01P 1/36
333/1.1
(Continued)

FOREIGN PATENT DOCUMENTS

JP    2005-176341 A    6/2005
JP    2005-210607 A    8/2005
(Continued)

OTHER PUBLICATIONS

International Search Report issued for Application No. PCT/JP2019/005868, dated May 14, 2019.

(Continued)

*Primary Examiner* — Kevin Kim
(74) *Attorney, Agent, or Firm* — Pearne & Gordon LLP

(57) ABSTRACT

A multilayer substrate includes a dielectric substrate, a pair of capacitor electrodes, and an input/output electrode that is an electrode for input, an electrode for output, or an electrode for input and output. The dielectric substrate has a first main surface and a second main surface that are opposite to each other in a thickness direction of the dielectric substrate. The pair of capacitor electrodes is disposed in the dielectric substrate. Electrodes of the pair of capacitor electrodes face each other in the thickness direction. The input/output electrode is disposed on the second main surface of the dielectric substrate. A capacitor that includes the pair of capacitor electrodes and a portion being part of the dielectric substrate and located between the electrodes of the pair of capacitor electrodes at least partially overlaps the input/output electrode electrically connected to the capacitor.

12 Claims, 16 Drawing Sheets

(51) Int. Cl.
    *H03H 7/46*       (2006.01)
    *H04B 1/16*       (2006.01)

(56)         References Cited

U.S. PATENT DOCUMENTS

| | | | |
|---|---|---|---|
| 2003/0034124 A1* | 2/2003 | Sugaya | H01P 11/007 |
| | | | 156/291 |
| 2003/0147197 A1 | 8/2003 | Uriu et al. | |
| 2009/0236941 A1* | 9/2009 | Nakai | H03H 9/1035 |
| | | | 310/340 |
| 2010/0315760 A1* | 12/2010 | Krishnan | H01G 4/10 |
| | | | 361/313 |
| 2013/0194723 A1* | 8/2013 | Felten | C08L 1/02 |
| | | | 361/502 |
| 2017/0338789 A1 | 11/2017 | Mukai | |
| 2018/0006624 A1 | 1/2018 | Baba | |
| 2018/0068796 A1* | 3/2018 | Seo | H01G 4/30 |

FOREIGN PATENT DOCUMENTS

| | | |
|---|---|---|
| JP | 2007-318657 A | 12/2007 |
| JP | 6206625 B1 | 10/2017 |
| WO | 01-69710 A1 | 9/2001 |
| WO | 2016/136295 A1 | 9/2016 |
| WO | 2017/094574 A1 | 6/2017 |

OTHER PUBLICATIONS

Written Opinion issued for Application No. PCT/JP2019/005868, dated May 14, 2019.

\* cited by examiner

MULTILAYER SUBSTRATE, FILTER, MULTIPLEXER, RADIO-FREQUENCY FRONT-END CIRCUIT, AND COMMUNICATION DEVICE

This is a continuation of International Application No. PCT/JP2019/005868 filed on Feb. 18, 2019 which claims priority from Japanese Patent Application No. 2018-027444 filed on Feb. 19, 2018. The contents of these applications are incorporated herein by reference in their entireties.

BACKGROUND OF THE DISCLOSURE

Field of the Disclosure

The present disclosure generally relates to a multilayer substrate, a filter, a multiplexer, a radio-frequency front-end circuit, and a communication device and, more specifically, to a multilayer substrate including a capacitor and to a filter, a multiplexer, a radio-frequency front-end circuit, and a communication device that include the multilayer substrate.

Description of the Related Art

A demultiplexing circuit known in the art includes a low-frequency-side filter and a high-frequency-side filter and is provided with a common terminal, a low-frequency-side terminal, and a high-frequency-side terminal (see, for example, Patent Document 1).

The low-frequency-side filter of the demultiplexing circuit described in Patent Document 1 includes a first transmission line and a series resonant circuit. The first transmission line is connected to the common terminal. The series resonant circuit of the low-frequency-side filter includes: a second transmission line connected between the low-frequency-side terminal and the ground; and a first capacitor. The high-frequency-side filter includes a second capacitor, a third capacitor, and a series resonant circuit. The second capacitor is connected to the common terminal. The third capacitor is connected between the second capacitor and the high-frequency-side terminal. The series resonant circuit of the high-frequency-side filter includes: a third transmission line connected between the ground and a connection point between the third capacitor and the second capacitor; and a fourth capacitor.

The demultiplexing circuit described in Patent Document 1 includes a layered substrate. The first to fourth capacitors are electrostatic capacitors. The electrostatic capacitors are formed as electrode patterns with areal extension and are provided in fifth to seventh layers, which are dielectric sheets.

Patent Document 1: Japanese Unexamined Patent Application Publication No. 2005-210607

BRIEF SUMMARY OF THE DISCLOSURE

The layered substrate (multilayer substrate) described in Patent Document 1 may be incorporated into an electronic module in a manner so as to be mounted on a circuit board. In such an electronic component, stray capacitance may arise between the circuit board and the first to fourth capacitors. As a result, the desired characteristics (filter characteristics) of the electronic component may not be achieved.

It is an object of the present disclosure to provide a multilayer substrate, a filter, a multiplexer, a radio-frequency front-end circuit, and a communication device that are capable of suppressing stray capacitance.

A multilayer substrate according to an aspect of the present disclosure includes a dielectric substrate, a pair of capacitor electrodes, and an input/output electrode that is an electrode for input, an electrode for output, or an electrode for input and output. The dielectric substrate has a first main surface and a second main surface that are opposite to each other in a thickness direction of the dielectric substrate. The pair of capacitor electrodes is disposed in the dielectric substrate. Electrodes of the pair of capacitor electrodes face each other in the thickness direction. The input/output electrode is disposed on the second main surface of the dielectric substrate. A capacitor that includes the pair of capacitor electrodes and a portion being part of the dielectric substrate and located between the electrodes of the pair of capacitor electrodes at least partially overlaps the input/output electrode electrically connected to the capacitor.

A filter according to another aspect of the present disclosure includes the multilayer substrate. The multilayer substrate includes a plurality of the input/output electrodes and a plurality of the capacitors. The plurality of input/output electrodes include: an antenna-side terminal connected to an antenna; and a terminal different from the antenna-side terminal. The plurality of capacitors include a series-arm capacitor that is disposed on a path forming a connection between the antenna-side terminal and the terminal and is connected to the terminal.

A multiplexer according to still another aspect of the present disclosure includes the multilayer substrate. The multilayer substrate includes a plurality of the input/output electrodes and a plurality of the capacitors. The plurality of input/output electrodes include: an antenna-side terminal connected to an antenna; and a first terminal and a second terminal that are different from the antenna-side terminal. The plurality of capacitors include: a series-arm capacitor that is disposed on a path forming a connection between the antenna-side terminal and the first terminal and is connected to the first terminal so as to be part of a first filter; and a series-arm capacitor that is disposed on a path forming a connection between the antenna-side terminal and the second terminal and is connected to the second terminal so as to be part of a second filter.

A radio-frequency front-end circuit according to still another aspect of the present disclosure includes the multiplexer and an amplifier circuit connected to the multiplexer.

A communication device according to still another aspect of the present disclosure includes the radio-frequency front-end circuit and an RF signal processing circuit. The RF signal processing circuit processes radio-frequency signals received through the antenna. The radio-frequency front-end circuit transmits the radio-frequency signals between the antenna and the RF signal processing circuit.

The multilayer substrate, the filter, the multiplexer, the radio-frequency front-end circuit, and the communication device according to the aspects of the present disclosure can suppress stray capacitance.

DETAILED DESCRIPTION OF THE DISCLOSURE

The following describes a multilayer substrate, a filter, a multiplexer, a radio-frequency front-end circuit, and a communication device according to an embodiment, with reference to the drawings.

FIGS. 1 to 7, 10, 11A, 11B, 12, 13A, 13B, 14, 15A, 15B, and 16, which will be referred to in, for example, the following embodiments, are schematic views, in which constituent elements are not drawn to scale and the size and thickness ratios thereof may not fully correspond to the actual dimension ratios.

Embodiments

The following describes a multilayer substrate 1 according to an embodiment and a multiplexer 100 including the multilayer substrate 1, with reference to the drawings.

(1) Overall Configuration of Multilayer Substrate

The following describes the multilayer substrate 1 according to the present embodiment with reference to FIGS. 1 to 7.

Figure 1:
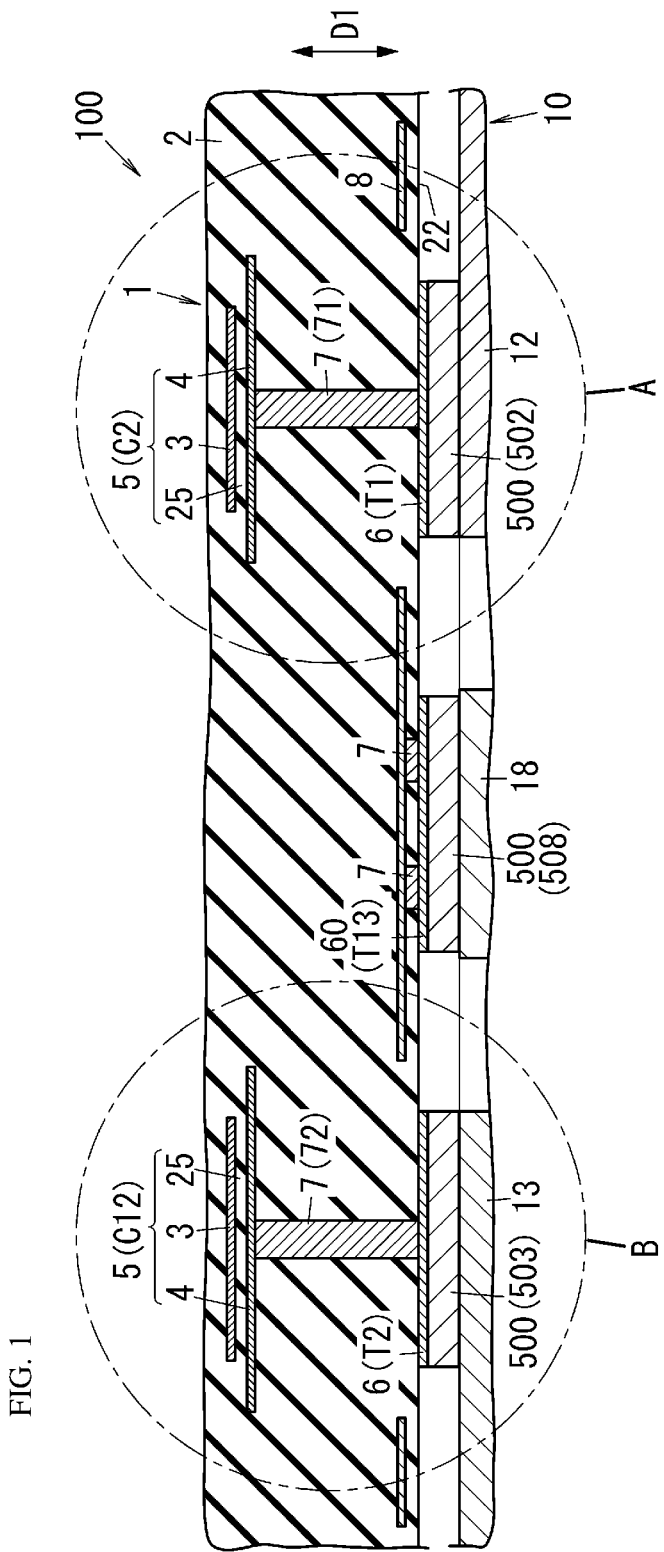
FIG. 1 is a sectional view of a multiplexer including a multilayer substrate according to an embodiment of the present disclosure, illustrating the state in which the multiplexer is mounted on a circuit board.
Figure 4:
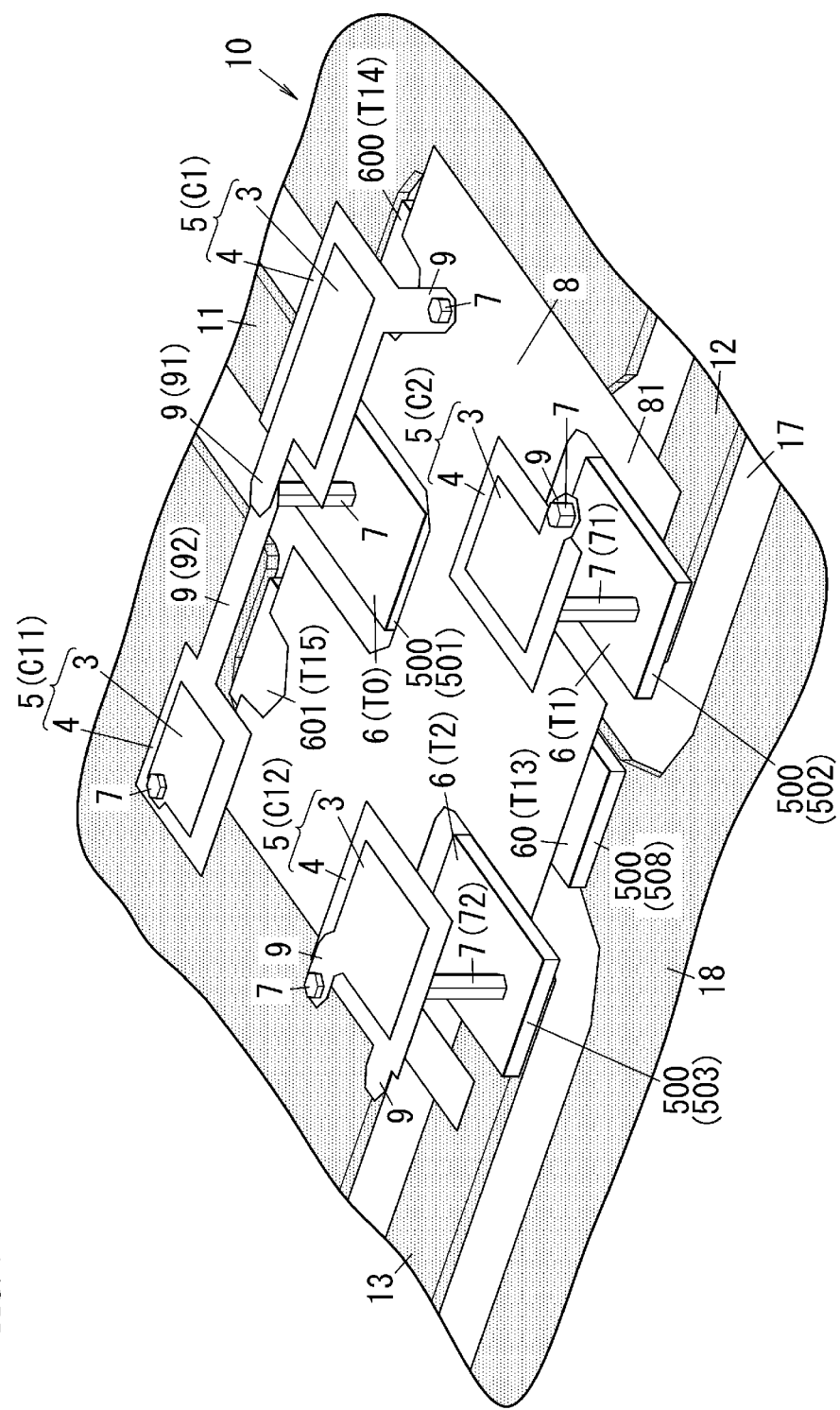
FIG. 4 is a perspective view of the multiplexer including the multilayer substrate according to the embodiment of the present disclosure, illustrating the state in which the multiplexer is mounted on a circuit board and being provided to describe the relative positional relationship between each capacitor, each input/output electrode, and a ground layer of the multilayer substrate.
Figure 5:
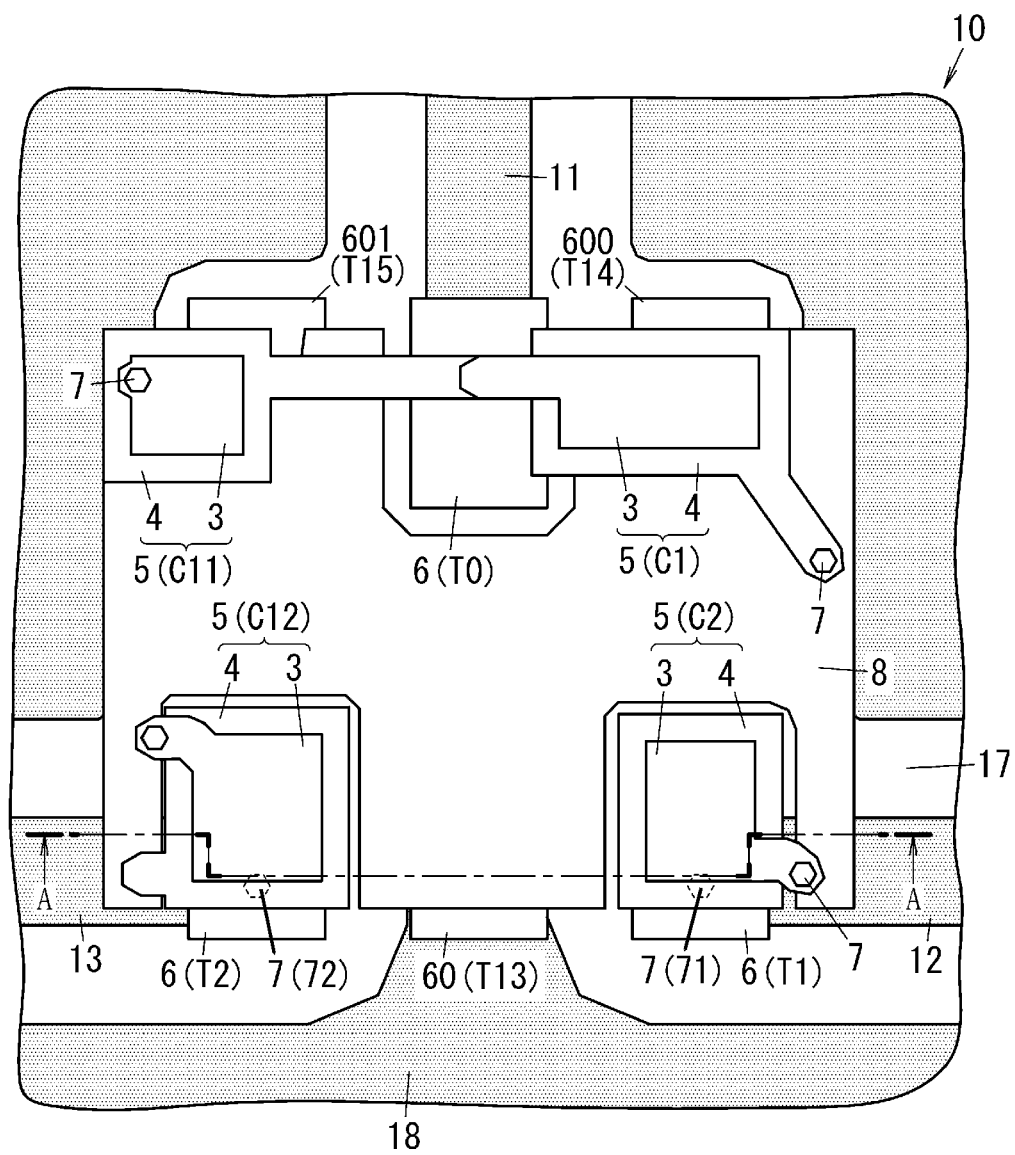
FIG. 5 is a plan view of the multiplexer including the multilayer substrate, illustrating the state in which the multiplexer is mounted on the circuit board and being provided to describe the relative positional relationship between each capacitor, each input/output electrode, and the ground layer of the multilayer substrate.

The multilayer substrate 1 according to the present embodiment includes a plurality of capacitors 5 (eight capacitors 5). Of the eight capacitors 5, two capacitors 5 are illustrated in FIG. 1. Of the eight capacitors 5, four capacitors 5 are illustrated in FIGS. 4 and 5. A dielectric substrate 2 is omitted from FIGS. 4 and 5.

As illustrated in FIG. 1, the multilayer substrate 1 includes: the dielectric substrate 2, pairs (e.g., eight pairs) of capacitor electrodes, each pair being provided for the corresponding one of the capacitors 5 and including a capacitor electrode 3 and a capacitor electrode 4 (hereinafter also referred to as electrodes 3 and 4 for short); a plurality of input/output electrodes 6 (e.g., three input/output electrodes 6); a ground electrode 60; a control electrode 600 (see FIG. 7); and a power supply electrode 601 (see FIG. 7).

Figure 6:
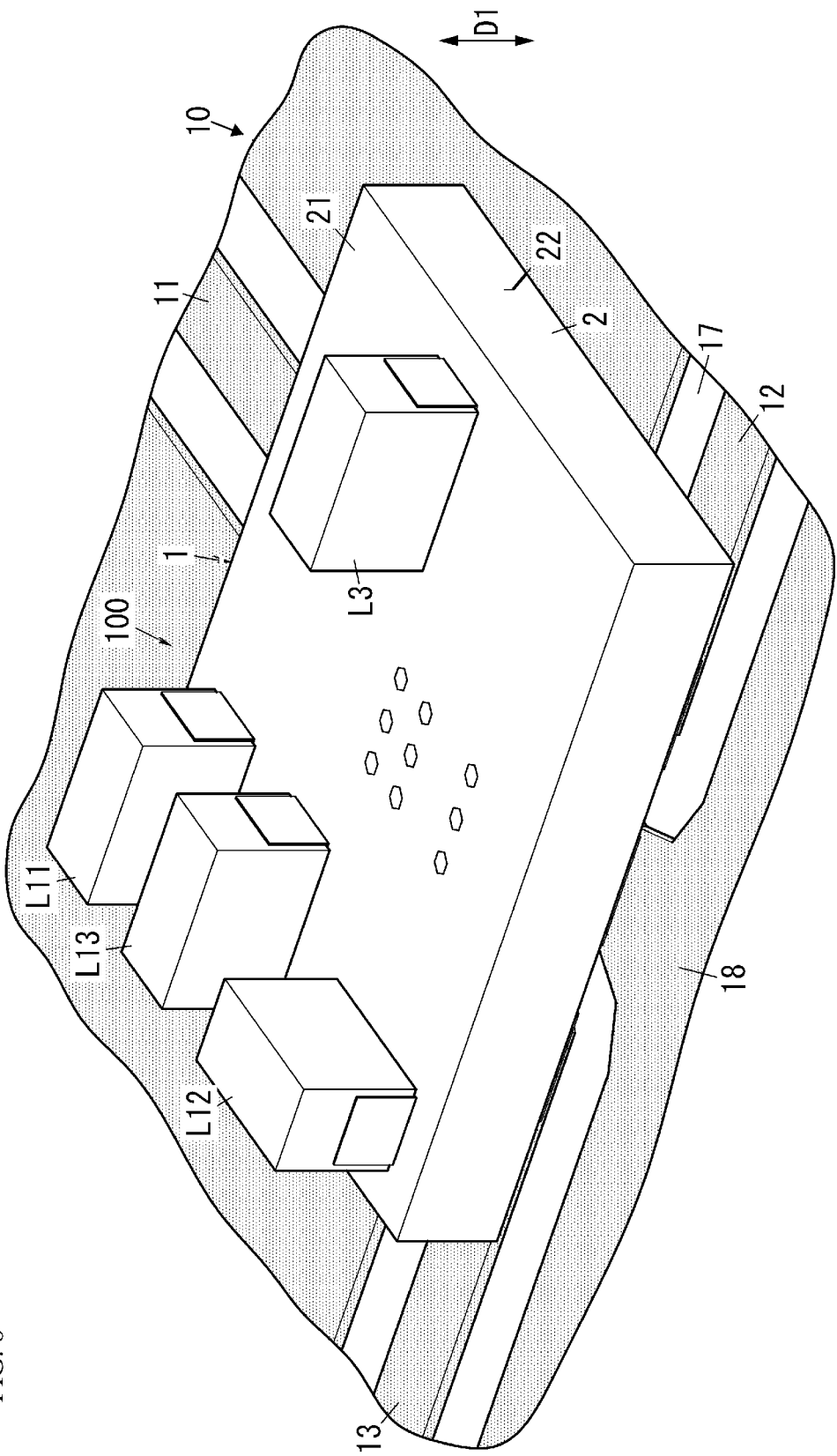
FIG. 6 is a perspective view of a communication device in which the multiplexer including the multilayer substrate is mounted on the circuit board, illustrating the communication device viewed from a first main surface side of the dielectric substrate.
Figure 7:
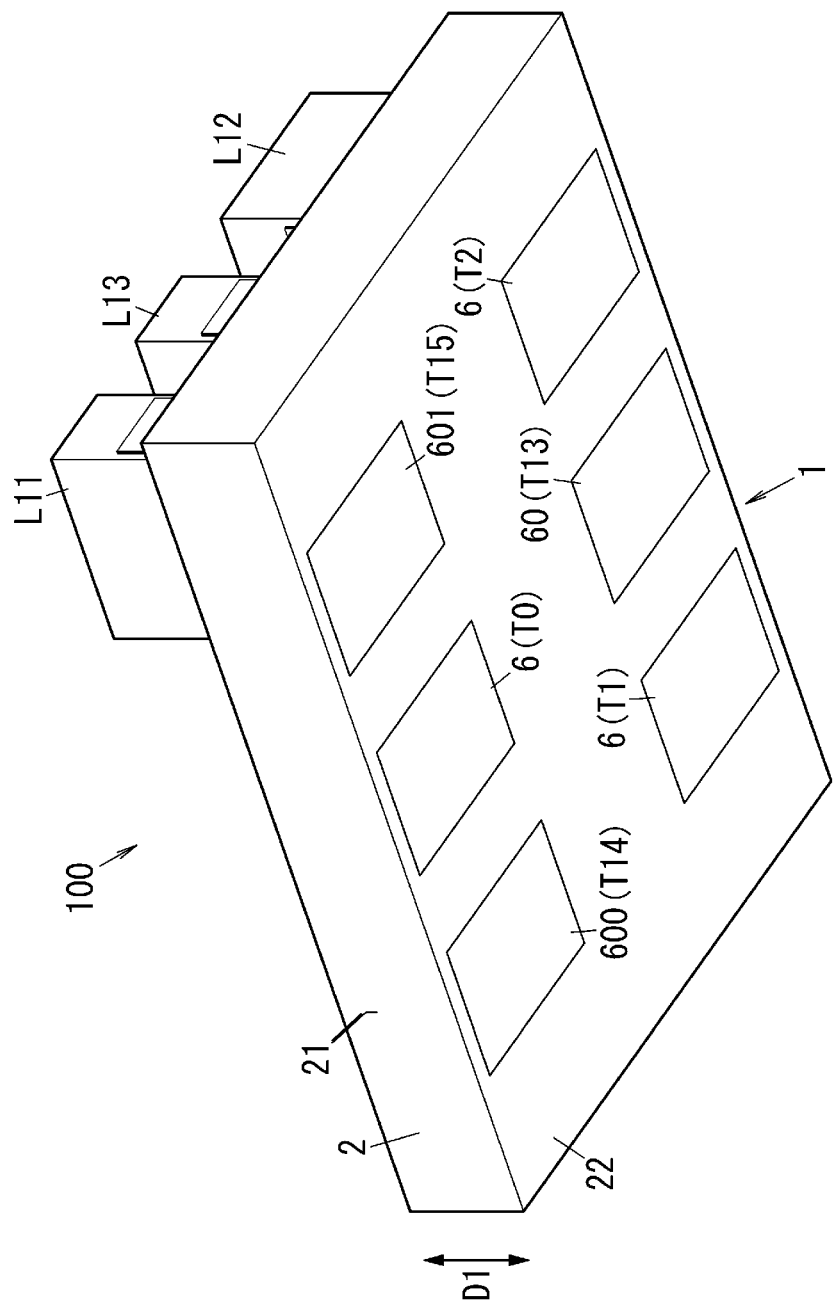
FIG. 7 is a perspective view of the multiplexer including the multilayer substrate, illustrating the multiplexer viewed from a second main surface side of the dielectric substrate.

The dielectric substrate 2 has a first main surface 21 and a second main surface 22, which are opposite to each other in a thickness direction D1 of the dielectric substrate 2 (see FIGS. 6 and 7). The electrodes 3 and 4 paired with each other face each other in the thickness direction D1 of the dielectric substrate 2. The electrodes 3 and 4 paired with each other are disposed in the dielectric substrate 2. The input/output electrodes 6, the ground electrode 60, the control electrode 600 (see FIG. 7), and the power supply electrode 601 (see FIG. 7) are disposed on the second main surface 22 of the dielectric substrate 2.

As illustrated in FIGS. 1 and 4, the multilayer substrate 1 in actual use is mounted on, for example, a circuit board 10. The input/output electrodes 6, the ground electrode 60, the control electrode 600, and the power supply electrode 601 are in one-to-one correspondence with connecting portions 500 and are connected to the circuit board 10 via the corresponding connecting portions 500. The connecting portions 500 are made from, for example, solder. The circuit board 10 is not a constituent element of the multilayer substrate 1. The circuit board 10 is, for example, a printed wiring board.

Figure 2:
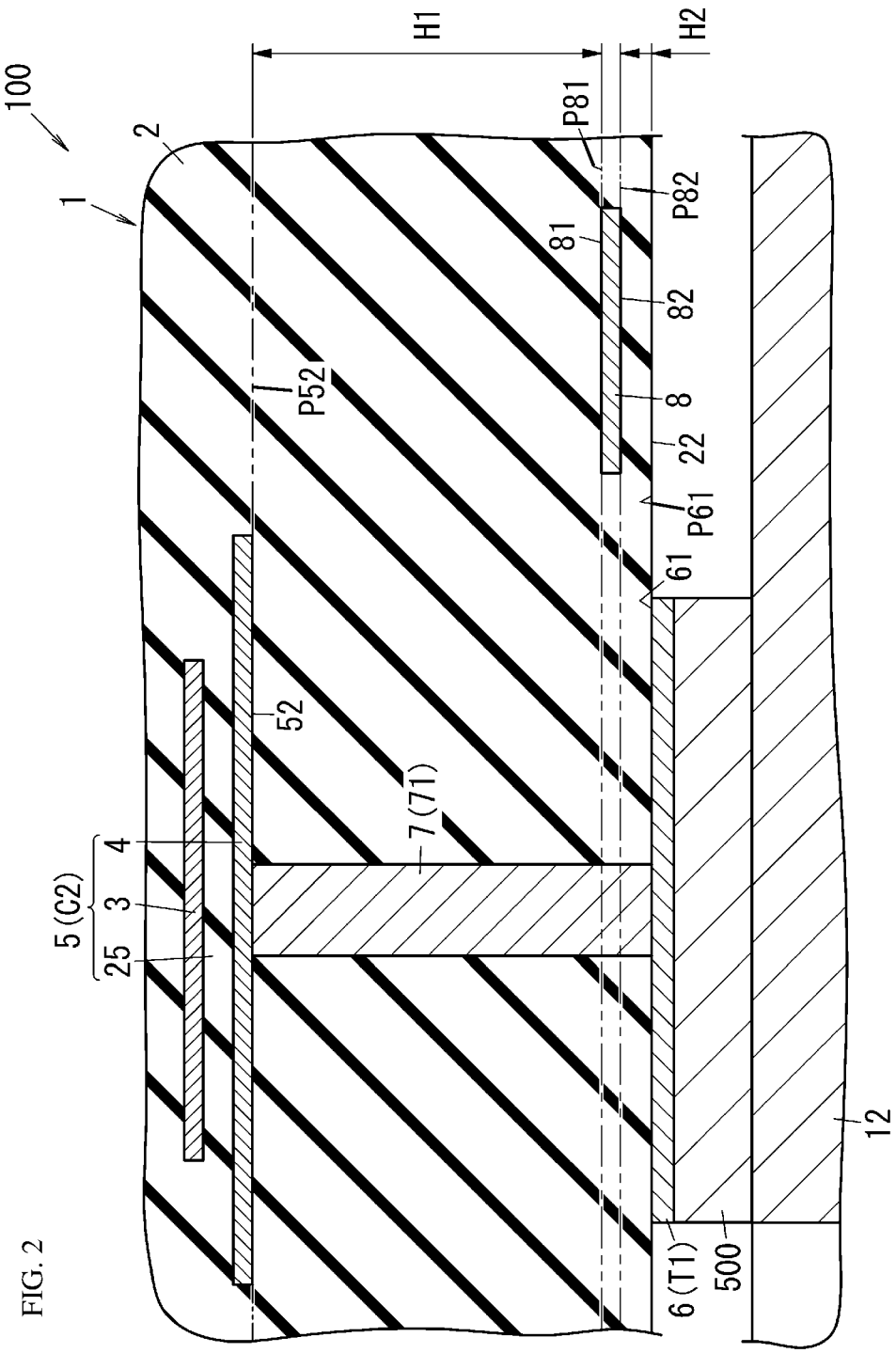
FIG. 2 is an enlarged view of a principal part A illustrated in FIG. 1.
Figure 3:
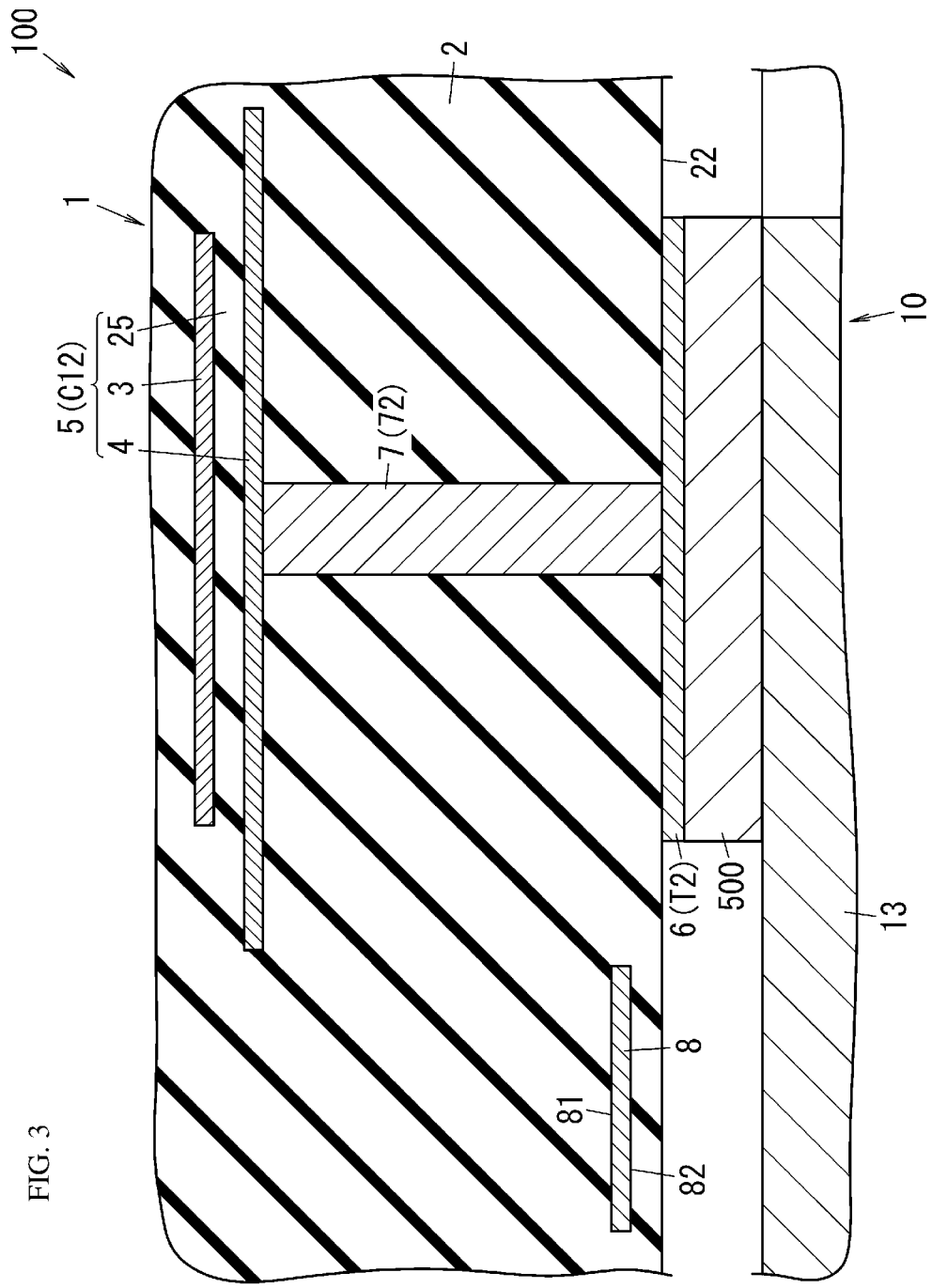
FIG. 3 is an enlarged view of a principal part B illustrated in FIG. 1.

As illustrated in FIGS. 1 to 3, each capacitor 5 in the multilayer substrate 1 includes the electrodes 3 and 4 paired with each other and a (dielectric) portion 25, which is part of the dielectric substrate 2 and is located between the electrodes 3 and 4. The electrodes 3 and 4 are paired electrodes for the corresponding one of the capacitors 5. The multilayer substrate 1 according to the present embodiment includes pairs (e.g., eight pairs) of electrodes, each pair including the electrodes 3 and 4.

(2) Overall Configuration of Multiplexer

Figure 8:
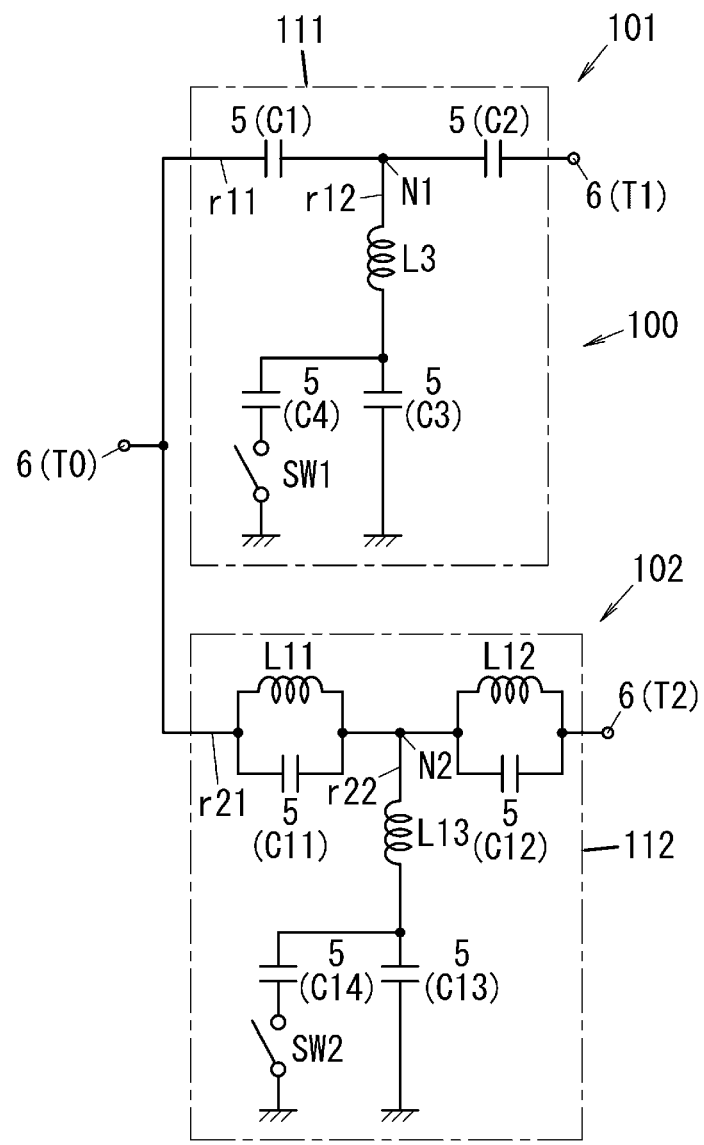
FIG. 8 is a circuit diagram of the multiplexer including the multilayer substrate.

The multiplexer 100 according to the present embodiment is a diplexer and includes, as illustrated in FIG. 8, two filters, namely, a filter 101 and a filter 102. To be distinguishable from each other, the filters 101 and 102 may be herein referred to as a first filter 101 and a second filter 102, respectively.

The first filter 101 includes: an antenna-side terminal T0; a first terminal T1, which is different from the antenna-side terminal T0; and a first filter functional unit 111. The antenna-side terminal T0 is electrically connected to an antenna external to the first filter 101. The first filter functional unit 111 is disposed between the antenna-side terminal T0 and the first terminal T1. The antenna-side terminal T0 and the first terminal T1 are ones of the input/output electrodes 6 of the multilayer substrate 1 and are different from each other.

As illustrated in FIG. 4, the antenna-side terminal T0 is electrically connected to a conductor portion 11 of the circuit board 10 via the connecting portion 500 (501). Thus, the antenna-side terminal T0 is electrically connected via, for example, the circuit board 10 to the antenna external to the first filter 101. As illustrated in FIG. 4, the first terminal T1 is electrically connected to, for example, a conductor portion 12 of the circuit board 10 via the connecting portion 500 (502). The conductor portion 12 is provided on an insulating layer 17 of the circuit board 10. Thus, the first terminal T1 is electrically connected via, for example, the circuit board 10 to an amplifier circuit external to the first filter 101 (see FIG. 8).

As illustrated in FIG. 8, the first filter 101 is an LC filter. Specifically, the first filter 101 is a T-type LC filter. The first filter functional unit 111 of the first filter 101 includes two series-arm capacitors (a series-arm capacitor C1 and a series-arm capacitor C2), a parallel-arm inductor L3, and a parallel-arm capacitor C3.

The series-arm capacitors C1 and C2 are disposed on a path r11 (hereinafter also referred to as first series-arm path r11), which forms a connection between the antenna-side terminal T0 and the first terminal T1. One end of the series-arm capacitor C1 in the first filter 101 is connected to the antenna-side terminal T0, and the other end of the series-arm capacitor C1 is connected to one end of the series-arm capacitor C2. The other end of the series-arm capacitor C2 in the first filter 101 is connected to the first terminal T1.

The parallel-arm inductor L3 and the parallel-arm capacitor C3 are disposed on a path r12 (a first parallel-arm path r12), which forms a connection between the ground (a ground terminal T13 in FIG. 4) and a node N1 on the first series-arm path r11. As illustrated in FIG. 4, the ground terminal T13 is the ground electrode 60 of the multilayer substrate 1. The multilayer substrate 1 includes a ground layer 8, which is electrically connected to the ground electrode 60. The ground terminal T13 is electrically connected to, for example, a ground conductor portion 18 of the circuit board 10 via the connecting portion 500 (508). The ground conductor portion 18 is provided on the insulating layer 17 of the circuit board 10. As illustrated in FIG. 8, the first filter 101 also includes a capacitor C4 (hereinafter also referred to as capacitance adjustment capacitor C4) and a switch SW1. The capacitance adjustment capacitor C4 and the switch SW1 in the first filter 101 constitute a series circuit, which is connected parallel to the parallel-arm capacitor C3.

The two series-arm capacitors (the series-arm capacitors C1 and C2), the parallel-arm capacitor C3, and the capacitance adjustment capacitor C4 in the first filter 101 are ones of the capacitors 5 included in the multilayer substrate 1 and are different from each other. The series-arm capacitor C1 is the capacitor 5 at the upper right in FIG. 5, and the series-arm capacitor C2 is the capacitor 5 at the lower right in FIG. 5. The distance between the second main surface 22 (see FIG. 6) of the dielectric substrate 2 and each of the series-arm capacitors C1 and C2 is greater than the distance between the first main surface (see FIG. 6) of the dielectric substrate 2 and each of the series-arm capacitors C1 and C2. The parallel-arm capacitor C3 and the capacitance adjustment capacitor C4 are not illustrated in FIG. 5.

The parallel-arm inductor L3 and the switch SW1 in the first filter 101 illustrated FIG. 8 are mounted on the multilayer substrate 1 so as to face the first main surface 21 of the dielectric substrate 2 as illustrated in FIG. 6, from which the switch SW1 is omitted. The parallel-arm inductor L3 is, for example, a surface-mount inductor. The switch SW1 is, for example, a semiconductor switch and includes a pair of main terminals and a control terminal. One terminal and the other terminal of the pair of main terminals of the switch SW1 are respectively connected to the capacitor C4 and the ground (the ground electrode 60 illustrated in FIGS. 4, 5, and 7). The control terminal of the switch SW1 is connected to the control electrode 600 (a controlling terminal T14) illustrated in FIGS. 4, 5, and 7. It is not required that the parallel-arm inductor L3 be a surface-mount inductor. The parallel-arm inductor L3 may be part of the multilayer substrate 1.

The first filter 101 allows passage of signals in the pass band of the first filter 101 and attenuates signals in frequency bands other than the pass band. On-off control of the switch SW1 in the first filter 101 is performed by a control circuit. Consequently, the attenuation pole frequency on the low-frequency side of the pass-band lower limit frequency of the first filter 101 varies, and the filter characteristics of the first filter 101 vary accordingly. The control circuit that performs on-off control of switch SW1 is electrically connected to the control terminal of the switch SW1. The control circuit is, for example, a controlling integrated circuit (IC). Constituent components of the control circuit may be mounted on the multilayer substrate 1. Alternatively, the components may be included in a radio-frequency front-end circuit including the multiplexer 100 or in a communication device including the multiplexer 100 in such a manner that the components are disposed outside the first filter 101.

As illustrated in FIG. 8, the second filter 102 includes: the antenna-side terminal T0; a second terminal T2, which is different from the antenna-side terminal T0; and a second filter functional unit 112. The antenna-side terminal T0 is electrically connected to the antenna external to the second filter 102. The second filter functional unit 112 is disposed between the antenna-side terminal T0 and the second terminal T2. The antenna-side terminal T0 and the second terminal T2 are ones of the input/output electrodes 6 of the multilayer substrate 1 and are different from each other. In the multiplexer 100, the antenna-side terminal T0 is a terminal common to the second filter 102 and the first filter 101.

As illustrated in FIG. 4, the antenna-side terminal T0 is electrically connected to the conductor portion 11 of the circuit board 10 via the connecting portion 500 (501). Thus, the antenna-side terminal T0 is electrically connected via, for example, the circuit board 10 to the antenna external to the second filter 102. The second terminal T2 is electrically connected to, for example, a conductor portion 13 of the circuit board 10 via the connecting portion 500 (503). The conductor portion 13 is provided on the insulating layer 17 of the circuit board 10. Thus, the second terminal T2 is electrically connected via, for example, the circuit board 10 to the amplifier circuit external to the second filter 102.

As illustrated in FIG. 8, the second filter 102 is an LC filter. Specifically, the second filter 102 is a T-type LC filter. The second filter functional unit 112 of the second filter 102 includes two series-arm capacitors (a series-arm capacitor C11 and a series-arm capacitor C12), two series-arm inductors (a series-arm inductor L11 and a series-arm inductor L12), a parallel-arm inductor L13, and a parallel-arm capacitor C13.

The series-arm capacitors C11 and C12 are disposed on a path r21 (hereinafter also referred to as second series-arm path r21), which forms a connection between the antenna-side terminal T0 and the second terminal T2. One end of the series-arm capacitor C11 in the second filter 102 is connected to the antenna-side terminal T0, and the other end of the series-arm capacitor C11 is connected to one end of the series-arm capacitor C12. The other end of the series-arm capacitor C12 in the second filter 102 is connected to the second terminal T2.

The series-arm inductor L11 is connected parallel to the series-arm capacitor C11. The series-arm inductor L12 is connected parallel to the series-arm capacitor C12.

The parallel-arm inductor L13 and the parallel-arm capacitor C13 are disposed on a path r22 (a second parallel-arm path r22), which forms a connection between the ground (the ground terminal T13 illustrated in FIGS. 4, 5, and 7) and a node N2 on the second series-arm path r21. As illustrated in FIGS. 4, 5, and 7, the ground terminal T13 is the ground electrode 60 of the multilayer substrate 1. The multilayer substrate 1 includes the ground layer 8 electrically connected to the ground electrode 60. The ground electrode 60 is electrically connected to, for example, the ground conductor portion 18 of the circuit board 10 via the connecting portion 500 (508). The ground conductor portion 18 is provided on the insulating layer 17 of the circuit board 10. As illustrated in FIG. 8, the second filter 102 also includes a capacitor C14 (hereinafter also referred to as capacitance adjustment capacitor C14) and a switch SW2. The capacitance adjustment capacitor C14 and the switch SW2 in the second filter 102 constitute a series circuit, which is connected parallel to the parallel-arm capacitor C13.

The two series-arm capacitors (the series-arm capacitors C11 and C12), the parallel-arm capacitor C13, and the capacitance adjustment capacitor C14 in the second filter 102 are ones of the capacitors 5 included in the multilayer substrate 1 and are different from each other. The series-arm capacitor C11 is the capacitor 5 at the upper left in FIG. 5, and the series-arm capacitor C12 is the capacitor 5 at the lower left in FIG. 5. The distance between the second main surface 22 (see FIGS. 1, 6, and 7) of the dielectric substrate 2 and each of the series-arm capacitors C11 and C12 is greater than the distance between the first main surface 21 (see FIGS. 6 and 7) of the dielectric substrate 2 and each of the series-arm capacitors C11 and C12. The parallel-arm capacitor C13 and the capacitance adjustment capacitor C14 are not illustrated in FIG. 5.

The parallel-arm inductor L13 and the switch SW2 in the second filter 102 are mounted on the multilayer substrate 1 so as to face the first main surface 21 of the dielectric substrate 2 as illustrated in FIG. 6, from which the switch SW2 is omitted. The parallel-arm inductor L13 is, for example, a surface-mount inductor. The switch SW2 is, for example, a semiconductor switch and includes a pair of main terminals and a control terminal. One terminal and the other terminal of the pair of main terminals of the switch SW2 are respectively connected to the capacitor C14 and the ground (the ground electrode 60 illustrated in FIGS. 4, 5, and 7). The control terminal of the switch SW2 is connected to the control electrode 600 (the controlling terminal T14) illustrated in FIGS. 4, 5, and 7. It is not required that the parallel-arm inductor L13 be a surface-mount inductor. The parallel-arm inductor L3 may be part of the multilayer substrate 1.

The second filter 102 allows passage of signals in the pass band of the second filter 102 and attenuates signals in frequency bands other than the pass band. On-off control of the switch SW2 in the second filter 102 is performed by a control circuit. Consequently, the attenuation pole frequency on the high-frequency side of the pass-band upper limit frequency of the second filter 102 varies, and the filter characteristics of the second filter 102 vary accordingly. The control circuit that performs on-off control of switch SW2 is electrically connected to the control terminal of the switch SW2. The control circuit is, for example, a controlling IC. Constituent components of the control circuit may be mounted on the multilayer substrate 1. Alternatively, the components may be included in a radio-frequency front-end circuit including the multiplexer 100 or in a communication device including the multiplexer 100 in such a manner that the components are disposed outside the second filter 102.

The first filter 101 and the second filter 102 have different pass bands. For example, the first filter 101 of the multiplexer 100 is a high-pass filter, and the second filter 102 of the multiplexer 100 is a low-pass filter. Thus, the pass band of the first filter 101 of the multiplexer 100 is in a frequency range higher than the pass band of the second filter 102 of the multiplexer 100. For example, the maximum frequency of the pass band of the second filter 102 of the multiplexer 100 is lower than the minimum frequency of the pass band of the first filter 101 of the multiplexer.

The multiplexer 100 (see FIGS. 1, 6, and 7) may also include a cover layer. For example, the cover layer is disposed on the first main surface 21 (see FIGS. 6 and 7) of the dielectric substrate 2 so as to cover the components mounted on the multilayer substrate 1, or more specifically, the parallel-arm inductor L3, the series-arm inductor L11, the series-arm inductor L12, the parallel-arm inductor L13, the switch SW1, and the switch SW2. The cover layer is made of, for example, an epoxy resin.

(3) Details of Multilayer Substrate

The dielectric substrate 2 (see FIGS. 1 to 3, 6, and 7) of the multilayer substrate 1 is plate-like in shape. The dielectric substrate 2 and the multilayer substrate 1 are, for example, rectangular when viewed in plan in the thickness direction D1 of the dielectric substrate 2.

The multilayer substrate 1 is a layered substrate including, for example, a plurality of dielectric layers and a plurality of conductor pattern layers. The dielectric layers and the conductor pattern layers are layered in the thickness direction D1 of the dielectric substrate 2. The dielectric substrate 2 (see FIGS. 1 to 3, 6, and 7) of the multilayer substrate 1 includes a plurality of dielectric layers. The dielectric layers of the dielectric substrate 2 in FIGS. 1 to 3, 6, and 7 are illustrated without boundaries between dielectric layers adjacent to each other in the thickness direction D1. Each dielectric layer has electrical insulation properties. The dielectric substrate 2 has electrical insulation properties accordingly. The outer shape of each dielectric layer is identical to the outer shape of the dielectric substrate 2. The conductor pattern layers are formed into the predetermined patterns. Each conductor pattern layer includes one or more conductor portions extending in a plane orthogonal to the thickness direction D1 of the dielectric substrate 2. Of the conductor pattern layers, two conductor pattern layers facing each other in the thickness direction D1 of the dielectric substrate 2 and associated with one capacitor 5 each include conductor portions. The electrode 3 of the capacitor 5 is one of the conductor portions included in one of the two conductor pattern layers, and the electrode 4 of the capacitor 5 is one of the conductor portions included in the other conductor pattern layer. FIG. 1 is a sectional view taken along line A-A in FIG. 5.

The multilayer substrate 1 is, for example, a low-temperature co-fired ceramics (LTCC) substrate. In this case, the conductor pattern layers are made of, for example, copper. Thus, the electrodes 3 and 4 paired with each other are made of, for example, copper. The material of the conductor pattern layers is not limited to copper and may be, for example, silver or gold. The dielectric layers may be made of the same material. Alternatively, the material of at least one of the dielectric layers may be different from the material of the other dielectric layers. The conductor pattern layers may be made of the same material.
Alternatively, the material of at least one of the conductor pattern layers may be different from the material of the other conductor pattern layers.

The ground layer 8 is one of the conductor pattern layers. The ground layer 8 is a conductor pattern layer that is different from a conductor pattern layer including at least one electrode 3, a conductor pattern layer including at least one electrode 4, and a conductor pattern layer including at least one external connection electrode (the input/output electrode 6, the ground electrode 60, the control electrode 600, or the power supply electrode 601).

The ground layer 8 is, for example, a ground electrode that is at ground potential via, for example, the circuit board 10. The ground layer 8 is closer to the second main surface 22 than to the first main surface 21 (see FIGS. 6 and 7) of the dielectric substrate 2. The distance between the ground layer 8 and the second main surface 22 is smaller than the distance between the ground layer 8 and the first main surface 21. The ground layer 8 has a first surface 81 (see FIGS. 2 and 3) and a second surface 82 (see FIGS. 2 and 3).

The first surface 81 is closer than the second surface 82 to the first main surface 21, and the second surface 82 is closer than the first surface 81 to the second main surface 22.

The conductor pattern layers incorporate part of wiring portions 9 (see FIG. 4) of the multiplexer 100. The wiring portions 9 include, for example, two wiring portions (a wiring portion 91 and a wiring portion 92) that form a connection between the series-arm capacitor C1 in the first filter 101 and the series-arm capacitor C11 in the second filter 102.

Of the circuit elements (the series-arm capacitors C1 and C2, the parallel-arm capacitor C3, the switch SW1, and the capacitor C4) of the first filter functional unit 111, only the series-arm capacitors C1 and C2 are illustrated in FIGS. 4 and 5.

Of the circuit elements (the series-arm capacitors C11 and C12, the series-arm inductors L11 and L12, the parallel-arm capacitor C13, the switch SW2, and the capacitor C14) of the second filter functional unit 112, only the series-arm capacitors C11 and C12 are illustrated in FIGS. 4 and 5.

The electrodes 3 and 4 paired with each other are, for example, rectangular when viewed in plan in the thickness direction D1 of the dielectric substrate 2 (see FIG. 5). The electrodes 3 and 4 paired with each other in the multilayer substrate 1 are of different sizes when viewed in plan in the thickness direction D1. The capacitance of the capacitor 5 including the electrodes 3 and 4 paired with each other is determined by the area of an overlap between the electrodes 3 and 4 viewed in plan in the thickness direction D1, the distance between the electrodes 3 and 4 in thickness direction D1, and the dielectric constant of the (dielectric) portion 25 being part of the dielectric substrate 2 and located between the electrodes 3 and 4. The capacitance of the capacitor 5 may be determined as appropriate in accordance with, for example, requirements specifications (filter characteristics) of the first filter 101 or the second filter 102 including the capacitor 5.

In the multilayer substrate 1 according to the present embodiment, the electrode 3, which is paired with the electrode 4 and is closer than the electrode 4 to the first main surface 21 of the dielectric substrate 2, has an electrode area smaller than the electrode area of the electrode 4 closer to the second main surface 22 of the dielectric substrate 2. The electrode area of the electrode 3 corresponds to the size of the electrode 3 viewed in plan in the thickness direction D1. The electrode area of the electrode 4 corresponds to the size of the electrode 4 viewed in plan in the thickness direction D1. When the electrodes 3 and 4 paired with each other are viewed in plan in the thickness direction D1, the electrode 3 is located on the inner side with respect to the periphery of the capacitor electrode 4 and entirely overlaps the electrode 4 (see FIG. 5). Alternatively, the electrodes 3 and 4 paired with each other may be rectangular electrodes that are of the same size and may be disposed in such a manner that two long sides of the electrode 3 intersect two long sides of the electrode 4 (for example, at right angles) when the electrodes 3 and 4 paired with each other are viewed in plan in the thickness direction D1. This layout eliminates or reduces the possibility that the capacitance of the capacitor 5 will deviate from the desired capacitance (design capacitance) due to the misalignment between the electrodes 3 and 4 viewed in plan in the thickness direction D1. This layout also enables a reduction in the area of each of the electrodes 3 and 4 without reducing the facing area (the area of an overlap between the electrodes 3 and 4). Thus, the total amount of stray capacitance associated with the electrodes 3 and 4 paired with each other may be smaller in this layout than in the layout illustrated in FIG. 5.

As illustrated in FIG. 7, the input/output electrodes 6, the ground electrode 60, the control electrode 600, and the power supply electrode 601 are discretely disposed away from each other on the second main surface 22 of the dielectric substrate 2. The input/output electrodes 6, the ground electrode 60, the control electrode 600, and the power supply electrode 601 are electrically insulated from each other accordingly.

The input/output electrodes 6 include the antenna-side terminal T0, the first terminal T1, and the second terminal T2. The antenna-side terminal T0 is electrically connected to the series-arm capacitor C1 of the first filter functional unit 111 (see FIG. 8) and to the series-arm capacitor C11 in the second filter 102. The first terminal T1 is electrically connected to the series-arm capacitor C2 of the first filter functional unit 111. The second terminal T2 is electrically connected to the series-arm capacitor C12 of the second filter functional unit 112. The ground electrode 60 is electrically connected to the ground layer 8 (see FIG. 1). The control electrode 600 (the controlling terminal T14) is electrically connected to the control terminal of the switch SW1 of the first filter functional unit 111 (see FIG. 8) and to the control terminal of the switch SW2 of the second filter functional unit 112. The power supply electrode 601 (a power supply terminal T15) is electrically connected to a power supply.

As illustrated in FIGS. 1 and 4, the multilayer substrate 1 includes a plurality of via conductors 7. Each via conductor 7 extends through one or more dielectric layers and has a first end face and a second end face in thickness direction D1 of the dielectric substrate 2. Each via conductor 7 forms an electrical connection between a conductor portion of a conductor pattern layer in contact with the first end face and a conductor portion of a conductor pattern layer in contact with the second end face. The via conductors 7 and the conductor pattern layers may be made of the same material. Thus, the via conductors 7 are made of, for example, copper. The material of the via conductors 7 is not limited to copper and may be, for example, silver or gold.

The via conductors 7 include a via conductor 71 and a via conductor 72, each of which forms an electrical connection between the corresponding one of two capacitors 5 (the series-arm capacitors C2 and C12) and the corresponding one of two input/output electrodes 6 (the first terminal T1 and second terminal T2). The via conductor 71 forms an electrical connection between the series-arm capacitor C2 of the first filter functional unit 111 (see FIG. 8) and the input/output electrode 6 (the first terminal T1). The via conductor 72 forms an electrical connection between the series-arm capacitor C12 of the second filter functional unit 112 and the input/output electrode 6 (the second terminal T2).

In the multilayer substrate 1, the series-arm capacitor C2 of the first filter functional unit 111 and the input/output electrode 6 (the first terminal T1) are electrically connected to each other via only the via conductor 7 (71). More specifically, the series-arm capacitor C2 and the input/output electrode 6 (the first terminal T1) are electrically connected to each other via none of the wiring portions 9. In the multilayer substrate 1, the series-arm capacitor C12 of the second filter functional unit 112 and the input/output electrode 6 (the second terminal T2) are electrically connected to each other via only the via conductor 7 (72). More specifically, the series-arm capacitor C12 and the input/output electrode 6 (the second terminal T2) are electrically connected to each other via none of the wiring portions 9.

In the multilayer substrate 1, the ground layer 8 is disposed between the second main surface 22 of the dielectric substrate 2 and the capacitors 5 when viewed in the thickness direction D1 of the dielectric substrate 2.

In the multilayer substrate 1, a first distance H1 is greater than a second distance H2 as illustrated in FIG. 2. The first distance H1 is the distance between a plane P81 and a plane P52. The plane P81 includes the first surface 81 of the ground layer 8. The plane P52 includes surfaces 52, each of which is a surface closer than the other surface of the corresponding one of the capacitors 5 to the second main surface 22. The second distance H2 is the distance between a plane P82 and a plane 61. The plane P82 includes the second surface 82 of the ground layer 8. The plane P61 includes surfaces 61, each of which is a surface closer than the other surface of the corresponding one of the input/output electrodes 6 to the first main surface 21 of the dielectric substrate 2.

As illustrated in FIG. 5, the ground layer 8 is disposed in a manner so as not to overlap the series-arm capacitor C2 and the series-arm capacitor C12 when viewed in plan in the thickness direction D1 of the dielectric substrate 2. It should be noted that the ground layer 8 may overlap part of the series-arm capacitor C2 and part of the series-arm capacitor C12. Furthermore, the ground layer 8 is disposed in a manner so as not to overlap the input/output electrodes 6 when viewed in plan in the thickness direction D1 of the dielectric substrate 2. It should be noted that the ground layer 8 may overlap part of two input/output electrodes 6 (part of the first terminal T1 and part of the second terminal T2) when viewed in plan in the thickness direction D1 of the dielectric substrate 2. In this case, the area of an overlap between the ground layer 8 and one of the two input/output electrode 6 (the first terminal T1) is preferably smaller than the area of an overlap between the series-arm capacitor C2 and the input/output electrode 6 (the first terminal T1), and the area of an overlap between the ground layer 8 and the other input/output electrode 6 (the second terminal T2) is preferably smaller than the area of an overlap between the series-arm capacitor C12 and the input/output electrode 6 (the second terminal T2).

The ground layer 8 is disposed in a manner so as not to overlap at least part of the control electrode 600 and at least part of the power supply electrode 601 when viewed in the thickness direction D1 of the dielectric substrate 2.

Furthermore, the ground layer 8 is disposed in a manner so as to overlap at least part of the ground electrode 60 when viewed in the thickness direction D1 of the dielectric substrate 2. In the multilayer substrate 1, the ground layer 8 and the ground electrode 60 are electrically connected to each other via only the via conductors 7 extending in the thickness direction D1 of the dielectric substrate 2. The multilayer substrate 1 includes more than one via conductors 7 that form connections between the ground layer 8 and the ground electrode 60.

(4) Effects

The multilayer substrate 1 according to the present embodiment includes the dielectric substrate 2, the capacitor electrodes 3 and 4 paired with each other, and the input/output electrodes 6, each of which is an electrode for input, an electrode for output, or an electrode for input and output. The dielectric substrate 2 has the first main surface 21 and the second main surface 22, which are opposite to each other in the thickness direction D1 of the dielectric substrate 2. The electrodes 3 and 4 paired with each other are disposed in the dielectric substrate 2. The capacitor electrodes 3 and 4 paired with each other face each other in the thickness direction D1. The input/output electrodes 6 are disposed on the second main surface 22 of the dielectric substrate 2. The capacitor electrodes 3 and 4 paired with each other and the portion 25 being part of the dielectric substrate 2 and located between the capacitor electrodes 3 and 4 constitute the capacitor 5, at least part of which overlaps the input/output electrode 6 that is electrically connected to the capacitor 5.

In the multilayer substrate 1 according to the present embodiment, the capacitors 5 at least partially overlap the corresponding input/output electrodes 6, and the stray capacitance between the circuit board 10 and each of the capacitors 5 may be suppressed accordingly. More specifically, the multilayer substrate 1 according to the present embodiment eliminates or reduces the region in which the ground conductor portion 18 of the circuit board 10 having the multilayer substrate 1 mounted thereon faces the capacitors 5 in the thickness direction D1 of the dielectric substrate 2. The multilayer substrate 1 according to the present embodiment thus suppresses stray capacitance arising from the region in which the ground conductor portion 18 of the circuit board 10 faces the capacitors 5 in the thickness direction D1 of the dielectric substrate 2. In this way, the multilayer substrate 1 according to the present embodiment eliminates or reduces the possibility that the insertion loss and the attenuation characteristics of each of the first filter 101 and the second filter 102 will deteriorate. Including the multilayer substrate 1 according to the present embodiment enables the first filter 101 and the second filter 102 to exhibit the desired filter characteristics, irrespective of the arrangement of conductor patterns such as the ground conductor portion 18 of circuit board 10.

The capacitor electrodes 3 and 4 paired with each other in the multilayer substrate 1 according to the present embodiment are of different sizes when viewed in plan in the thickness direction D1 of the dielectric substrate 2. In the multilayer substrate 1 according to the present embodiment, the capacitor electrode 3, which is one electrode whose area is smaller than the other electrode of the pair of the capacitor electrodes, is more likely to entirely overlap the capacitor electrode 4, whose area is larger than the area of the capacitor electrode 3. This eliminates or reduces the possibility that the capacitance of the capacitor 5 will deviate from the desired capacitance (design capacitance) due to the misalignment between the capacitor electrodes 3 and 4 viewed in plan in the thickness direction D1 of the dielectric substrate 2.

The multilayer substrate 1 according to the present embodiment also includes the via conductors 7 (the via conductors 71 and 72), each of which forms an electrical connection between the corresponding one of the capacitors 5 (the series-arm capacitors C2 and C12) and the corresponding one of the input/output electrodes 6 (the first terminal T1 and the second terminal T2). The capacitors 5 (the series-arm capacitor C2 and C12) are connected to the corresponding input/output electrodes 6 (the first terminal T1 and the second terminal T2) via only the respective via conductors 7 (the via conductors 71 and 72). This feature enables the multilayer substrate 1 according to the present embodiment to suppress unwanted inductance.

The multilayer substrate 1 according to the present embodiment also includes the ground layer 8, which is electrically conductive. The ground layer 8 is closer to the second main surface 22 than to the first main surface 21 of the dielectric substrate 2. This feature enables the multilayer substrate 1 according to the present embodiment to further suppress the stray capacitance that can arise between the circuit board 10 and the capacitors 5.

In the multilayer substrate 1 according to the present embodiment, the ground layer 8 is disposed between the second main surface 22 of the dielectric substrate 2 and the capacitors 5 when viewed in the thickness direction D1 of the dielectric substrate 2. This feature enables the multilayer substrate 1 to further suppress the stray capacitance between the circuit board 10 and each of the capacitors 5.

The ground layer 8 in the multilayer substrate 1 according to the present embodiment has the first surface 81 closer to the first main surface 21 and the second surface 82 closer to the second main surface 22. The first distance H1 is greater than the second distance H2. The first distance H1 is the distance between the plane including the first surface 81 of the ground layer 8 and the plane including the surfaces each of which is a surface closer than the other surface of the corresponding one of the capacitors 5 (the series-arm capacitors C2 and C12) to the second main surface 22. The second distance H2 is the distance between the plane including the second surface 82 of the ground layer 8 and the plane including surfaces each of which is a surface closer than the other surface of the corresponding one of the input/output electrodes 6 to the first main surface 21 of the dielectric substrate 2. This feature enables the multilayer substrate 1 according to the present embodiment to further suppress the capacitive coupling between the ground layer 8 and each of the capacitors 5.

In the multilayer substrate 1 according to the present embodiment, the ground layer 8 is disposed in a manner so as not to overlap the input/output electrodes 6 when viewed in the thickness direction D1 of the dielectric substrate 2. This feature enables the multilayer substrate 1 according to the present embodiment to suppress the stray capacitance between the ground layer 8 and each of the input/output electrodes 6.

In the multilayer substrate 1 according to the present embodiment, the ground layer 8 is disposed in a manner so as not to overlap the capacitors 5 when viewed in the thickness direction D1 of the dielectric substrate 2. This feature enables the multilayer substrate 1 according to the present embodiment to suppress the stray capacitance between the ground layer 8 and each of the capacitors 5.

The multiplexer 100 according to the present embodiment includes the multilayer substrate 1. The multilayer substrate 1 includes the input/output electrodes 6 and the capacitors 5. The input/output electrodes 6 include: the antenna-side terminal T0 connected to the antenna; and the first terminal T1 and the second terminal T2 that are different from the antenna-side terminal T0. The capacitors 5 include: the series-arm capacitor C2, which is disposed on the path r11 forming a connection between the antenna-side terminal T0 and the first terminal T1 and is connected to the first terminal T1 so as to be part of the first filter 101; and the series-arm capacitor C12, which is disposed on the path r21 forming a connection between the antenna-side terminal T0 and the second terminal T2 and is connected to the second terminal T2 so as to be part of the second filter 102.

The multiplexer 100 according to the present embodiment enables the suppression of stray capacitance between the circuit board 10 having the multilayer substrate 1 mounted thereon and each of the series-arm capacitors C2 and C12. In this way, the multiplexer 100 according to the present embodiment eliminates or reduces the possibility that the insertion loss and the attenuation characteristics of each of the first filter 101 and the second filter 102 will deteriorate.

(5) Radio-Frequency Front-End Circuit

Figure 9:
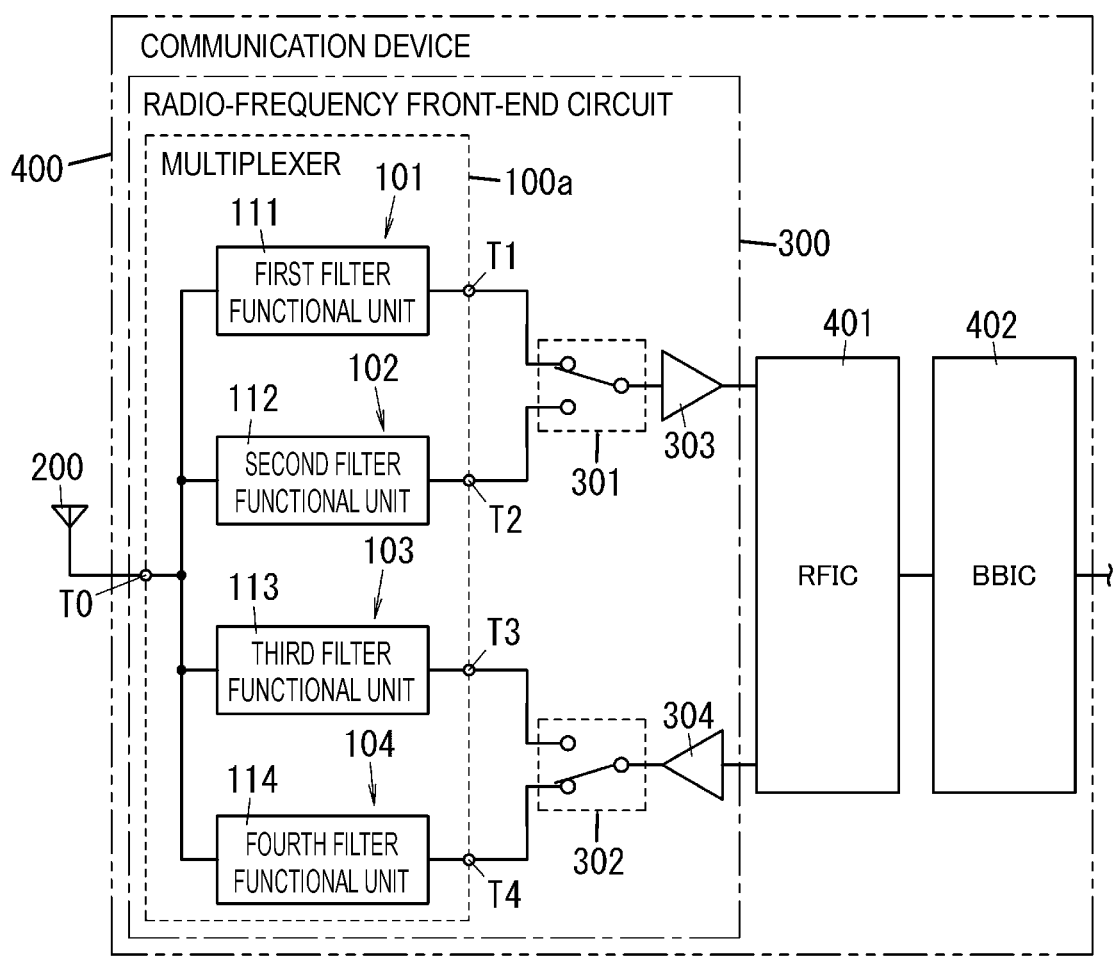
FIG. 9 is a configuration diagram of a communication device incorporating a multiplexer including a multilayer substrate according to Modification 1 of the embodiment of the present disclosure.

The following describes a radio-frequency front-end circuit 300 according to the present embodiment with reference to FIG. 9.

The radio-frequency front-end circuit 300 includes a multiplexer 100a, an amplifier circuit 303 (hereinafter also referred to as the first amplifier circuit 303), and a switching circuit 301 (hereinafter also referred to as the first switching circuit 301). The radio-frequency front-end circuit 300 also includes an amplifier circuit 304 (hereinafter also referred to as the second amplifier circuit 304) and a switching circuit 302 (hereinafter also referred to as the second switching circuit 302). The radio-frequency front-end circuit 300 may optionally include the second amplifier circuit 304 and the second switching circuit 302. Constituent elements of the multiplexer 100a that are similar to the constituent elements of the multiplexer 100 are denoted by the same reference signs, and redundant description thereof will be omitted.

In addition to having the configuration of the multiplexer 100 illustrated in FIG. 8, the multiplexer 100a includes a third terminal T3, a fourth terminal T4, a third filter functional unit 113, and a fourth filter functional unit 114. The multiplexer 100a includes, in addition to the first filter 101 and the second filter 102, a third filter 103 and a fourth filter 104 accordingly.

The third filter 103 includes the antenna-side terminal T0, the third filter functional unit 113, and the third terminal T3. The third filter functional unit 113 is disposed between the antenna-side terminal T0 and the third terminal T3. The third filter 103 is a first transmission-side filter. The third filter 103 allows passage of signals in the pass band of the third filter 103 and attenuates signals in frequency bands other than the pass band.

The fourth filter 104 includes the antenna-side terminal T0, the fourth filter functional unit 114, and the fourth terminal T4. The fourth filter functional unit 114 is disposed between the antenna-side terminal T0 and the fourth terminal T4. The fourth filter 104 is a second transmission-side filter. The fourth filter 104 allows passage of signals in the pass band of the fourth filter 104 and attenuates signals in frequency bands other than the pass band.

The first amplifier circuit 303 amplifies radio-frequency signals (reception signals) transmitted through an antenna 200, the multiplexer 100a, and the first switching circuit 301 and outputs the resultant signals. The first amplifier circuit 303 is a low-noise amplifier circuit.

The first switching circuit 301 includes: two selection terminals respectively connected to the first terminal T1 and the second terminal T2 of the multiplexer 100a; and a common terminal connected to the first amplifier circuit 303. That is, the first switching circuit 301 is connected to the first filter functional unit 111 via the first terminal T1 and is connected to the second filter functional unit 112 via the second terminal T2.

The first switching circuit 301 is, for example, a single-pole, double-throw (SPDT) switch. The first switching circuit 301 is controlled by a control circuit. The first switching circuit 301 connects the common terminal to one of the two selection terminals in accordance with a control signal from the control circuit. The first switching circuit 301 may be a switching IC.

The second amplifier circuit 304 amplifies radio-frequency signals (transmission signals) outputted by a component outside the radio-frequency front-end circuit 300 (e.g., an RF signal processing circuit 401, which will be described later) and outputs the resultant signals to the antenna 200 through the second switching circuit 302 and the multiplexer 100a. The second amplifier circuit 304 is a power amplifier circuit.

The second switching circuit 302 is, for example, an SPDT switch. The second switching circuit 302 is controlled by the control circuit. The second switching circuit 302 connects the common terminal to one of the two selection terminals in accordance with a control signal from the control circuit. The second switching circuit 302 may be a switching IC.

(6) Communication Device

As illustrated in FIG. 9, the communication device 400 includes the RF signal processing circuit 401 and the radio-frequency front-end circuit 300. The RF signal processing circuit 401 processes radio-frequency signals received through the antenna 200. The radio-frequency front-end circuit 300 transmits radio-frequency signals (reception signals and transmission signals) between the antenna 200 and the RF signal processing circuit 401. The communication device 400 also includes a baseband signal processing circuit 402. The baseband signal processing circuit 402 may be optionally included.

The RF signal processing circuit 401 is, for example, a radio-frequency integrated circuit (RFIC) and processes radio-frequency signals (reception signals). The RF signal processing circuit 401 performs, for example, signal processing such as down-conversion on radio-frequency signals (reception signals) inputted from the antenna 200 through the radio-frequency front-end circuit 300 and outputs the resultant reception signals to the baseband signal processing circuit 402. The baseband signal processing circuit 402 is, for example, a baseband integrated circuit (BBIC). The reception signals processed by the baseband signal processing circuit 402 are used, for example, as image signals for displaying an image or as audio signals for a telephone conversation.

The RF signal processing circuit 401 performs, for example, signal processing such as up-conversion on radio-frequency signals (transmission signals) outputted by the baseband signal processing circuit 402 and outputs the resultant radio-frequency signals to the second amplifier circuit 304. The baseband signal processing circuit 402 performs, for example, certain signal processing on transmission signals received from outside the communication device 400.

(7) Modifications of Embodiment (7.1) Modification 1

Figure 10:
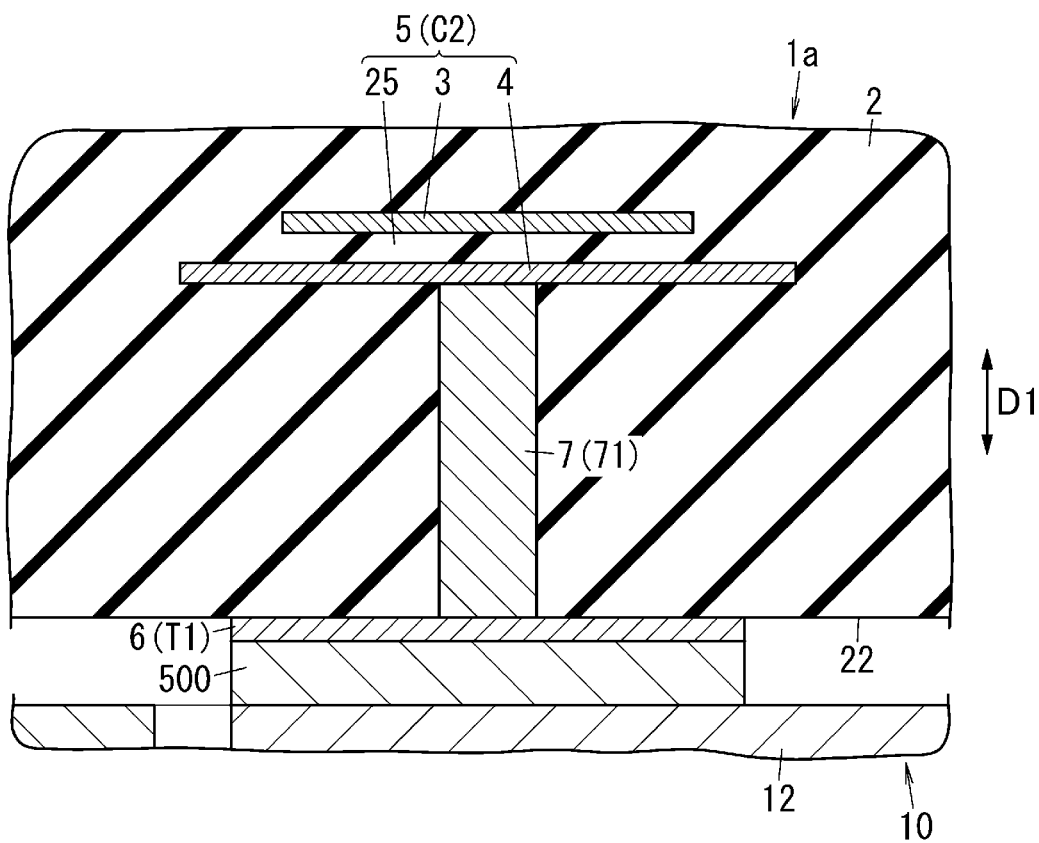
FIG. 10 is a sectional view of a multilayer substrate according to Modification 2 of the embodiment of the present disclosure, illustrating the state in which the multilayer substrate is mounted on a circuit board and being provided to describe the relative positional relationship between each capacitor and the corresponding input/output electrode of the multilayer substrate.
Figure 11A:
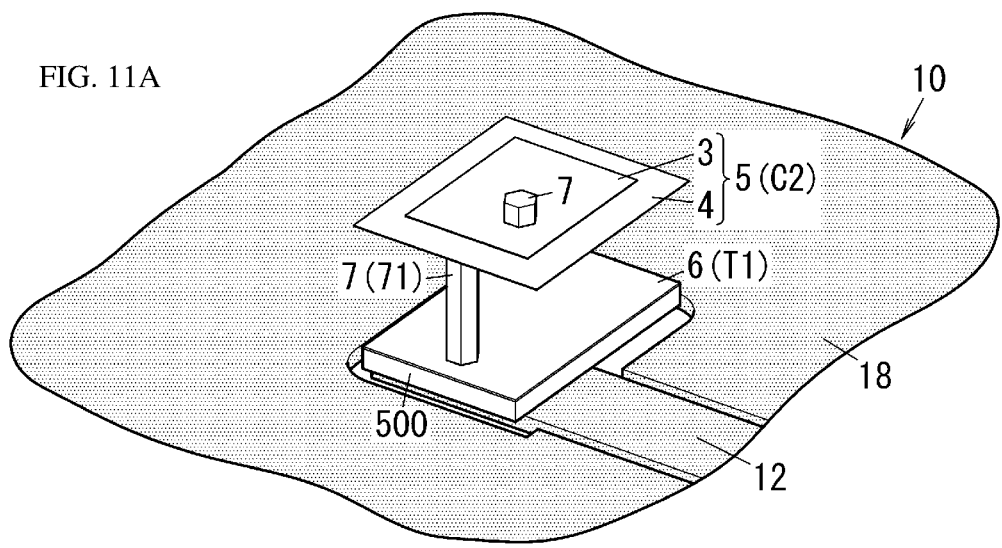
FIG. 11A is a perspective view of the multilayer substrate, illustrating the state in which the multilayer substrate is mounted on the circuit board and being provided to describe the relative positional relationship between each capacitor and the corresponding input/output electrode of the multilayer substrate.
Figure 11B:
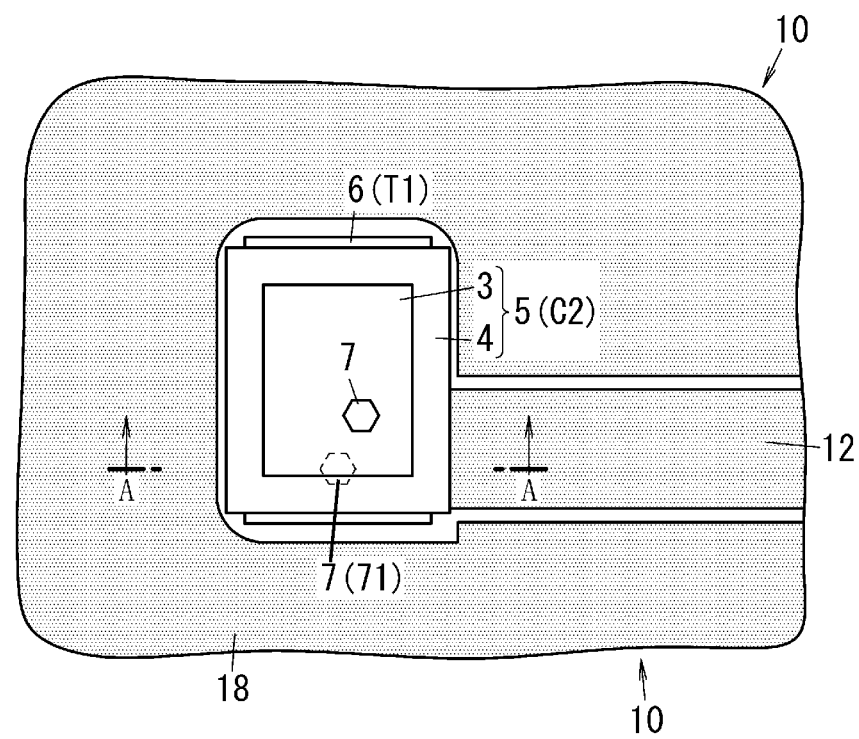
FIG. 11B is a plan view of the multilayer substrate, illustrating the state in which the multilayer substrate is mounted on the circuit board and being provided to describe the relative positional relationship between each capacitor and the corresponding input/output electrode of the multilayer substrate.

As illustrated in FIGS. 10, 11A, and 11B, a multilayer substrate 1a according to Modification 1 of the present embodiment differs from the multilayer substrate 1 according to the present embodiment in that the ground layer 8 (see FIGS. 1 and 4) of the multilayer substrate 1 is omitted. Furthermore, the layout of the via conductors 7 connected to the corresponding capacitor electrodes 3 in the multilayer substrate 1a according to Modification 1 is different from the layout of the via conductors 7 connected to the corresponding capacitor electrodes 3 in the multilayer substrate 1 according to the present embodiment. The layout concerned is a layout viewed in plan in the thickness direction D1 of the dielectric substrate 2. In the multilayer substrate 1a according to Modification 1, each via conductor 7 is connected to the corresponding capacitor electrode 3 without the wiring portion 9 (see FIG. 4) therebetween. The multilayer substrate 1a according to Modification 1 is otherwise similar to the multilayer substrate 1 according to the present embodiment, and redundant illustration or description thereof will be omitted where appropriate. Constituent elements of the multilayer substrate 1a according to Modification 1 that are similar to the constituent elements of the multilayer substrate 1 according to the present embodiment are denoted by the same reference signs, and redundant description thereof will be omitted. The dielectric substrate 2 is omitted from FIGS. 11A and 11B. FIG. 10 is a sectional view taken along line A-A in FIG. 11B.

As in the multilayer substrate 1 according to the present embodiment, the capacitors 5 in the multilayer substrate 1a according to Modification 1 at least partially overlap the corresponding input/output electrodes 6 connected to the capacitors 5, and the stray capacitance between the circuit board 10 and each of the capacitors 5 may be suppressed accordingly.

(7.2) Modification 2

Figure 12:
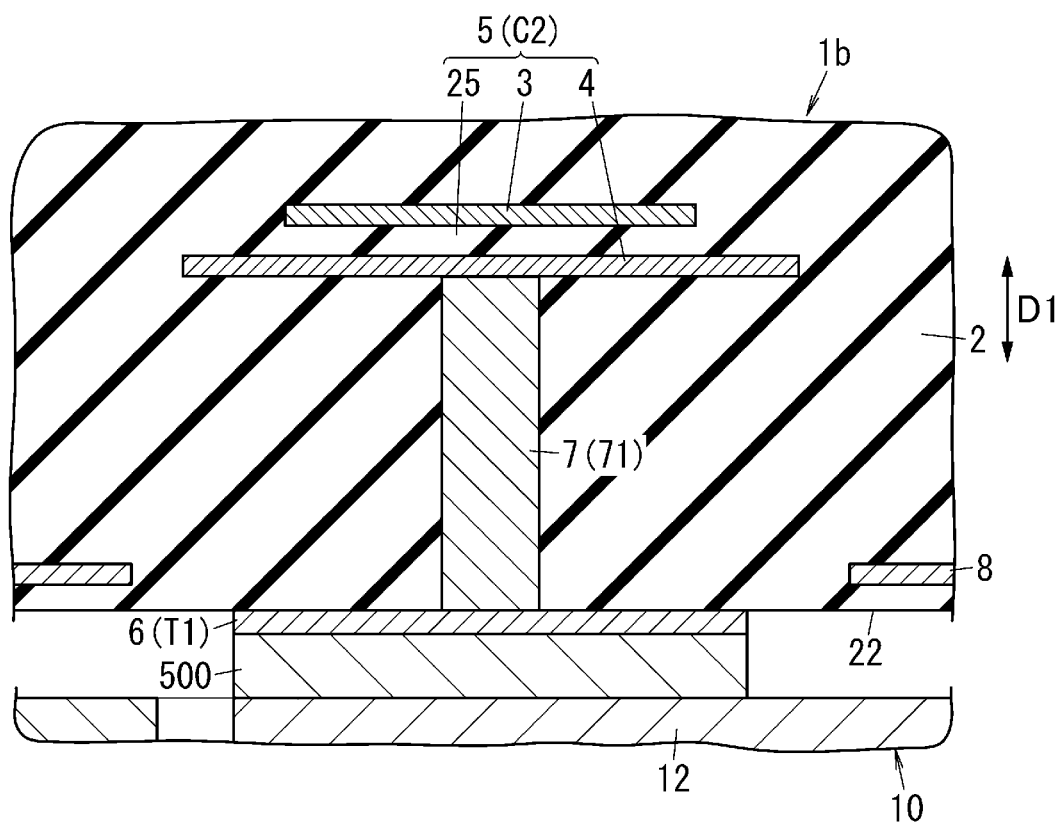
FIG. 12 is a sectional view of a multilayer substrate according to Modification 3 of the embodiment of the present disclosure, illustrating the state in which the multilayer substrate is mounted on a circuit board and being provided to describe the relative positional relationship between each capacitor and the corresponding input/output electrode of the multilayer substrate.
Figure 13A:
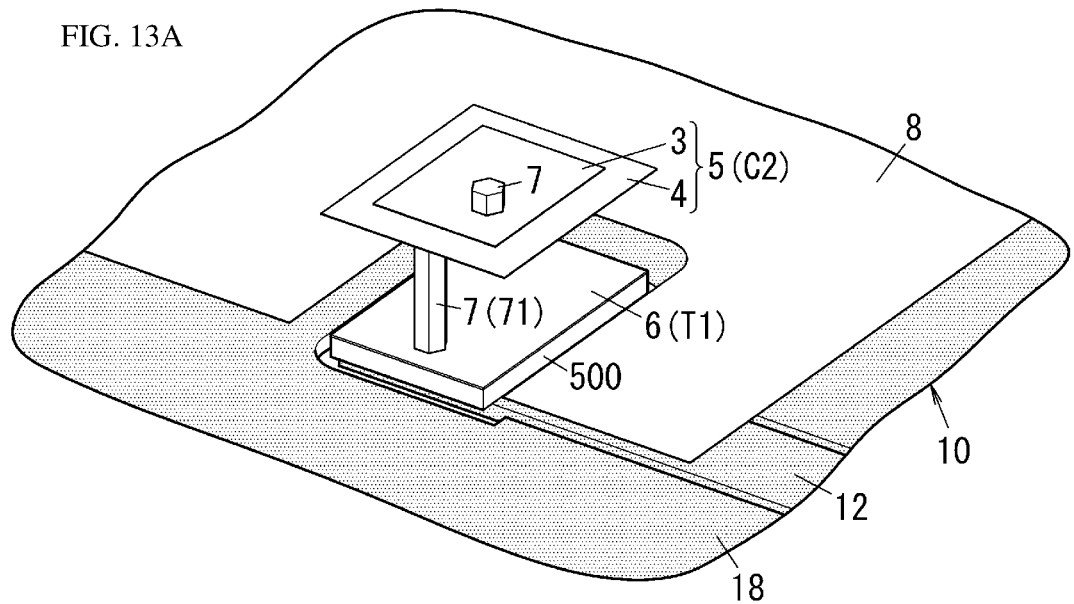
FIG. 13A is a perspective view of the multilayer substrate according to Modification 3, illustrating the state in which the multilayer substrate is mounted on the circuit board and being provided to describe the relative positional relationship between each capacitor and the corresponding input/output electrode of the multilayer substrate.
Figure 13B:
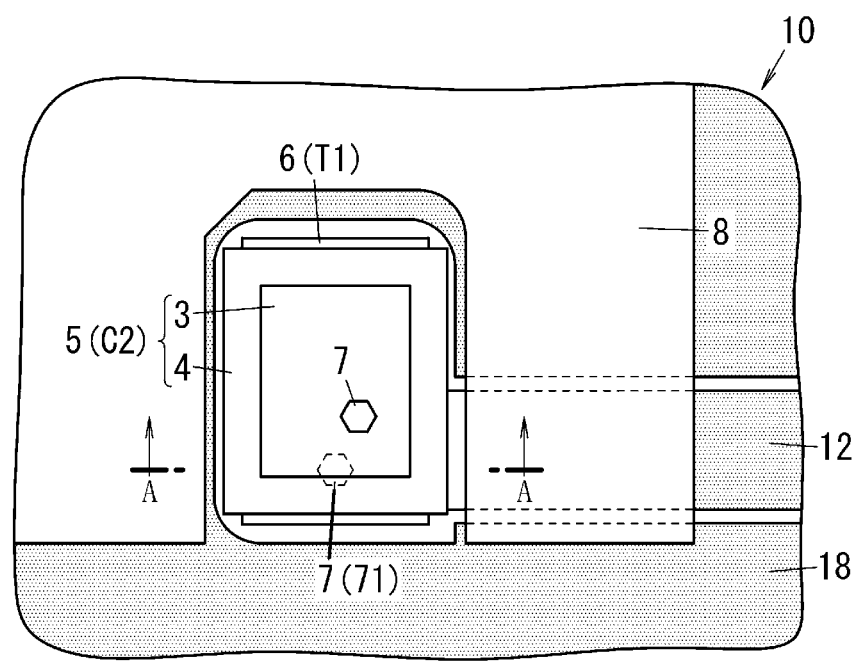
FIG. 13B is a plan view of the multilayer substrate, illustrating the state in which the multilayer substrate is mounted on the circuit board and being provided to describe the relative positional relationship between each capacitor and the corresponding input/output electrode of the multilayer substrate.

As illustrated in FIGS. 12, 13A, and 13B, the layout of the via conductors 7 connected to the corresponding capacitor electrodes 3 in a multilayer substrate 1b according to Modification 2 of the present embodiment is different from the layout of the via conductors 7 (FIGS. 1 to 5) connected to the corresponding capacitor electrodes 3 in the multilayer substrate 1 according to the present embodiment. The layout concerned is a layout viewed in plan in the thickness direction D1 of the dielectric substrate 2. In the multilayer substrate 1b according to Modification 2, each via conductor 7 is connected to the corresponding capacitor electrode 3 without the wiring portion 9 (see FIG. 4) therebetween. The multilayer substrate 1b according to Modification 2 is otherwise similar to the multilayer substrate 1 according to the present embodiment, and redundant illustration or description thereof will be omitted where appropriate. Constituent elements of the multilayer substrate 1b according to Modification 2 that are similar to the constituent elements of the multilayer substrate 1 according to the present embodiment are denoted by the same reference signs, and redundant description thereof will be omitted. The dielectric substrate 2 is omitted from FIGS. 13A and 13B. FIG. 12 is a sectional view taken along line A-A in FIG. 13B.

As in the multilayer substrate 1 according to the present embodiment, the capacitors 5 in the multilayer substrate 1b according to Modification 2 at least partially overlap the corresponding input/output electrodes 6, and the stray capacitance between the circuit board 10 and each of the capacitors 5 may be suppressed accordingly.

(7.3) Modification 3

Figure 14:
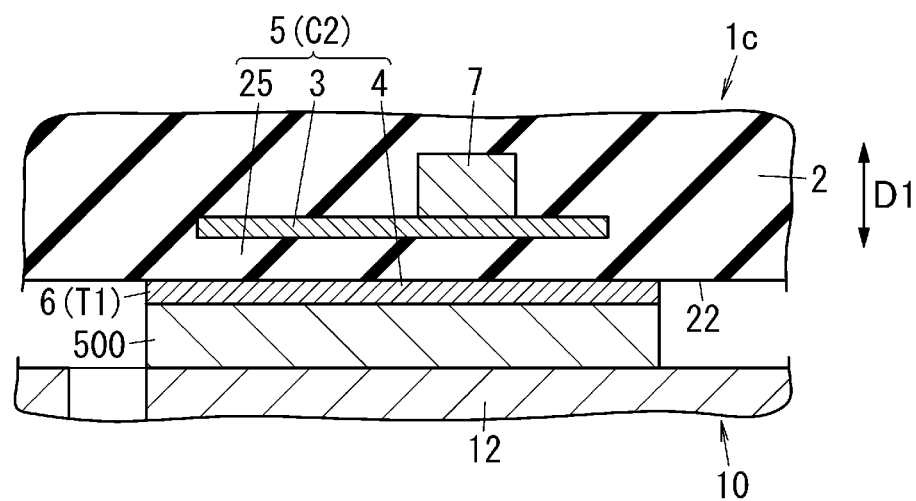
FIG. 14 is a sectional view of a multilayer substrate according to Modification 4 of the embodiment of the present disclosure, illustrating the state in which the multilayer substrate is mounted on a circuit board and being provided to describe the relative positional relationship between each capacitor and the corresponding input/output electrode of the multilayer substrate.
Figure 15A:
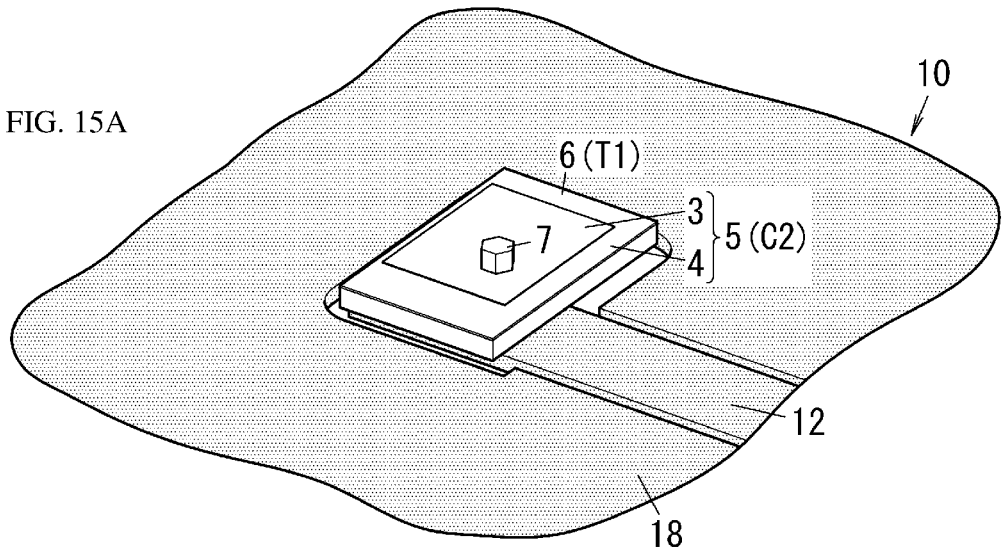
FIG. 15A is a perspective view of the multilayer substrate, illustrating the state in which the multilayer substrate is mounted on the circuit board and being provided to describe the relative positional relationship between each capacitor and the corresponding input/output electrode of the multilayer substrate.
Figure 15B:
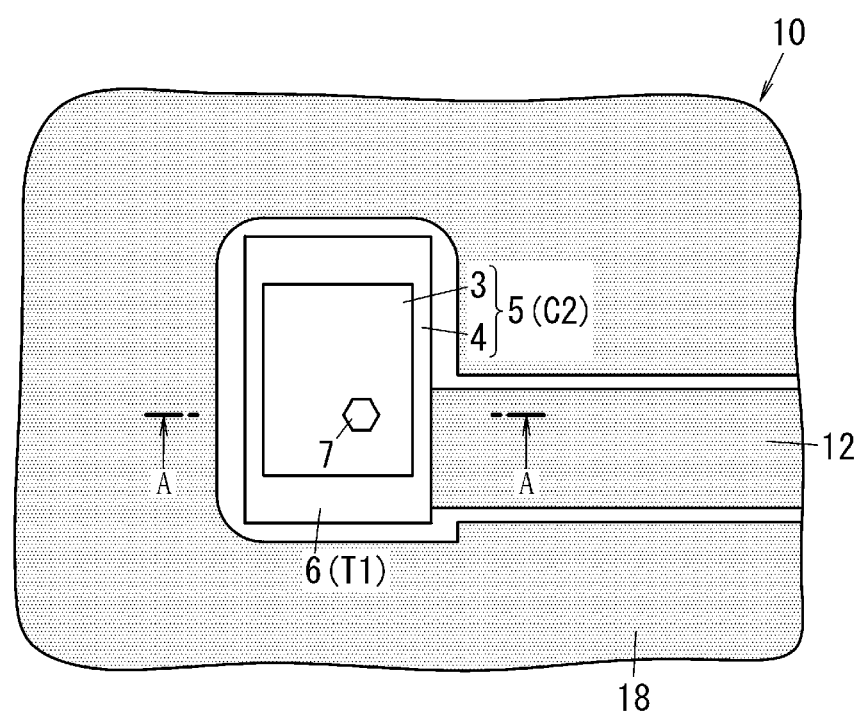
FIG. 15B is a plan view of the multilayer substrate, illustrating the state in which the multilayer substrate is mounted on the circuit board and being provided to describe the relative positional relationship between each capacitor and the corresponding input/output electrode of the multilayer substrate.

As illustrated in FIGS. 14, 15A, and 15B, each input/output electrode 6 in a multilayer substrate 1c according to Modification 3 of the present embodiment is also used as the capacitor electrode 4, which is paired with the capacitor electrode 3 of the capacitor 5 and is closer than the capacitor electrode 3 to the second main surface 22 of the dielectric substrate 2. The multilayer substrate 1c according to Modification 3 is otherwise similar to the multilayer substrate 1 according to the present embodiment, and redundant illustration or description thereof will be omitted where appropriate. Constituent elements of the multilayer substrate 1c according to Modification 3 that are similar to the constituent elements of the multilayer substrate 1 according to the present embodiment are denoted by the same reference signs, and redundant description thereof will be omitted. The dielectric substrate 2 is omitted from FIGS. 15A and 15B. FIG. 14 is a sectional view taken along line A-A in FIG. 15B.

In the multilayer substrate 1c according to Modification 3, unwanted inductance between each input/output electrode 6 and the corresponding capacitor 5 may be suppressed further than would be possible in the multilayer substrate 1 according to the present embodiment. The multilayer substrate 1c may be applied to a filter, which may in turn have improved transmission loss or improved attenuation characteristics.

(7.4) Modification 4

Figure 16:
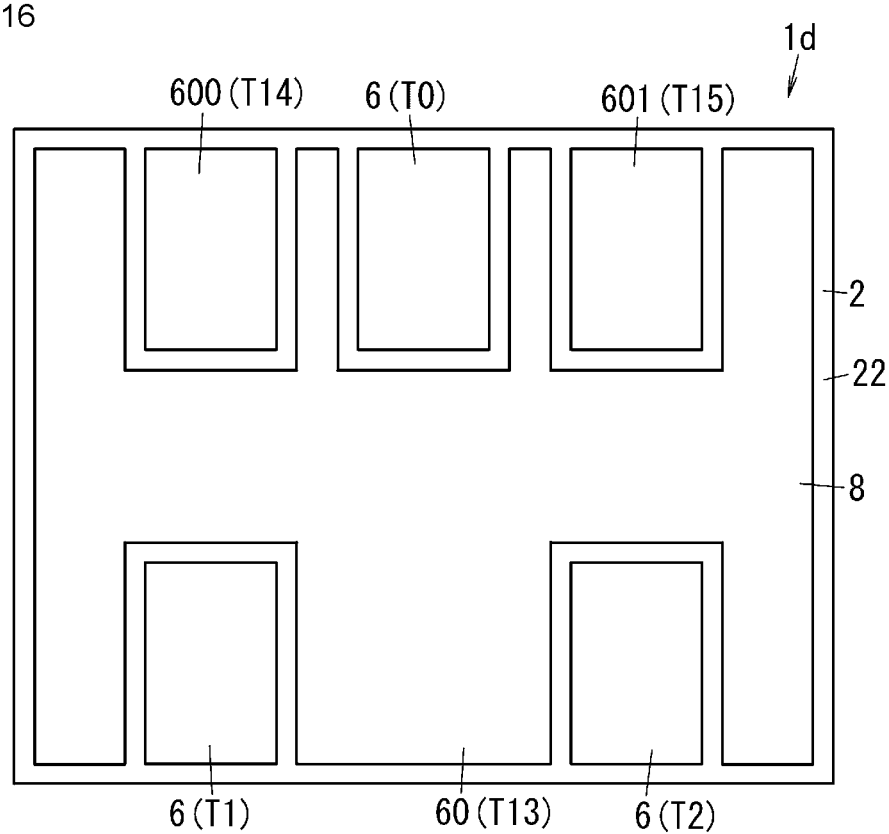
FIG. 16 is a bottom view of a multilayer substrate according to Modification 5 of the embodiment of the present disclosure.

As illustrated in FIG. 16, a multilayer substrate 1d according to Modification 4 differs from the multilayer substrate 1 (see FIGS. 1 to 7) in that the ground layer 8 is disposed on the second main surface 22 of the dielectric substrate 2. The multilayer substrate 1d according to Modification 4 is otherwise similar to the multilayer substrate 1 according to the present embodiment, and redundant illustration or description thereof will be omitted where appropriate. Constituent elements of the multilayer substrate 1d according to Modification 4 that are similar to the constituent elements of the multilayer substrate 1 according to the present embodiment are denoted by the same reference signs, and redundant description thereof will be omitted.

In the multilayer substrate 1d according to Modification 4, some portions of the ground layer 8 are located between two corresponding adjacent input/output electrodes 6 when viewed in plan in the thickness direction D1 (see FIG. 1) of the dielectric substrate 2. The multilayer substrate 1d according to Modification 4 is less likely to be affected by the circuit board 10. The ground layer 8 and the ground electrode 60 in the multilayer substrate 1d according to Modification 4 are provided as one member.

These embodiments, which have been described so far, are merely example embodiments of the present disclosure. Various alterations may be made to these embodiments in accordance with, for example, designs in such a manner that the objective of the present disclosure is achieved.

For example, the multilayer substrate 1 is not limited to an LTCC substrate and may be a high-temperature co-fired ceramics (HTCC) substrate or a resin multilayer substrate.

It is not required that the capacitor electrodes 3 and 4 paired with each other be rectangular. For example, the capacitor electrodes 3 and 4 paired with each other may be square or circular.

When the capacitor electrodes 3 and 4 paired with each other are viewed in plan in the thickness direction D1, the capacitor electrode 3 may be larger than the capacitor electrode 4. The multilayer substrate 1 may include more than one capacitor 5. In this case, the multilayer substrate 1 may include both the capacitor 5 in which the capacitor electrode 3 is smaller than the capacitor electrode 4 and the capacitor 5 in which the capacitor electrode 3 is larger than the capacitor electrode 4. The capacitor electrodes 3 and 4 paired with each other may be of the same size when viewed in plan in the thickness direction D1.

The ground layer 8 in the multilayer substrate 1 may overlap part of at least one of the input/output electrodes 6 when viewed in plan in the thickness direction D1 of the dielectric substrate 2.

The ground layer 8 in the multilayer substrate 1 may overlap part of at least one of the capacitors 5 when viewed in the thickness direction D1 of the dielectric substrate 2.

It is not required that the first filter 101 incorporate the series circuit including the capacitor C4 and the switch SW1, and the series circuit may be omitted. Similarly, it is not required that the second filter 102 incorporate the series circuit including the capacitor C14 and the switch SW2, and the series circuit may be omitted. The circuit configuration of the first filter 101 and the circuit configuration of the second filter 102 may be changed as appropriate. The first filter 101 and the second filter 102 are not limited to T-type LC filter and may be π-type LC filters.

It is not required that each of the first filter 101 and the second filter 102 be configured to handle transmission or reception only. Each of the first filter 101 and the second filter 102 may be configured to handle both transmission and reception. For example, the first filter 101 may be a filter that allows passage of radio-frequency signals in a high band specified by the Long Term Evolution (LTE) standard, and the second filter 102 may be a filter that allows passage of radio-frequency signals in a midband specified by the LTE standard.

It is not required that the multiplexer 100 be a constituent element of the radio-frequency front-end circuit 300 illustrated in FIG. 9. The multiplexer 100 may be a constituent component of a radio-frequency front-end circuit 300b illustrated in FIG. 17. Constituent elements of the radio-frequency front-end circuit 300b that are similar to the constituent components of the radio-frequency front-end circuit 300 are denoted by the same reference signs, and redundant description thereof will be omitted where appropriate.

The radio-frequency front-end circuit 300b is a reception front-end circuit. The radio-frequency front-end circuit 300b is configured to support simultaneous use of a plurality of (frequency) bands (e.g., carrier aggregation). The radio-frequency front-end circuit 300b includes the multiplexer 100, two switching circuits (switching circuits 311 and 312), five filters (filters 321, 322, 323, 324, and 325), and five amplifier circuits (amplifier circuits 331, 332, 333, 334, and 335).

As mentioned above, the multiplexer 100 includes the antenna-side terminal T0, the first terminal T1, the second terminal T2, the first filter functional unit 111, and the second filter functional unit 112.

The first filter functional unit 111 is disposed between the antenna-side terminal T0 and the first terminal T1. The first filter functional unit 111 is a high-pass filter. The pass band of the high-pass filter is a frequency range of a high-band group, and the attenuation band of the high-pass filter is a frequency range of a low-band group.

The second filter functional unit 112 is disposed between the antenna-side terminal T0 and the second terminal T2. The second filter functional unit 112 is a low-pass filter. The pass band of the low-pass filter is the frequency range of the low-band group, and the attenuation band of the low-pass filter is the frequency range of the high-band group.

The pass band of the first filter functional unit 111 is switched between a first frequency band and a second frequency band in accordance with an on-off action of the switch SW1 (see FIG. 8). The pass band of the second filter functional unit 112 is switched between a third frequency band and a fourth frequency band in accordance with an on-off action of the switch SW2 (see FIG. 8). The first and second frequency bands belong to a first frequency band group, and the third and fourth frequency bands belong to a second frequency band group.

The high-band group is the first frequency band group, and the low-band group is the second frequency band group.

The switching circuit 311 includes a common terminal 3110 and three selection terminals (selection terminals 3111, 3112, and 3113). In the switching circuit 311, the common terminal 3110 is connected to the first terminal T1 of the multiplexer 100. The switching circuit 311 is an SP3T switching circuit in which the common terminal 3110 may be connected to any one of three selection terminals (the selection terminal 3111, 3112, or 3113).

The switching circuit 312 includes a common terminal 3120 and two selection terminals (selection terminals 3121 and 3122). The switching circuit 312 is an SPDT switching circuit in which the common terminal 3120 may be connected to the selection terminal 3121 or 3122.

The filter 321 is connected to the selection terminal 3111 and is, for example, a band-pass filter whose pass band is LTE Band 7 (the reception band: 2,620 to 2,690 MHz). The filter 322 is connected to the selection terminal 3112 and is, for example, a band-pass filter whose pass band is LTE Band 40 (the reception band: 2,300 to 2,400 MHz). The filter 323 is connected to the selection terminal 3113 and is, for example, a band-pass filter whose pass band is LTE Band 41 (the reception band: 2,496 to 2,690 MHz). The filter 324 is connected to the selection terminal 3121 and is, for example, a band-pass filter whose pass band is LTE Band 1 (the reception band: 2,110 to 2,170 MHz). The filter 325 is connected to the selection terminal 3122 and is, for example, a band-pass filter whose pass band is LTE Band 3 (the reception band: 1,805 to 1,880 MHz). The order of the five bands associated with the LTE standard, from the lowest to the highest, is Band 3, Band 1, Band 40, Band 41, and Band 7. Bands 3 and 1 belong to the low-band group, and Bands 40, 41, and 7 belong to the high-band group.

The filters of the radio-frequency front-end circuit 300b are as follows. Each of the filters 322 and 323 is a filter whose pass band is the first frequency band. The filter 321 is a filter whose pass band is the second frequency band. The filter 325 is a filter whose pass band is the third frequency band. The filter 324 is a filter whose pass band is the fourth frequency band.

Each of the five amplifier circuits (the amplifier circuits 331 to 335) is connected to the corresponding one of the five filters (the filters 321 to 325). The five amplifier circuits (the amplifier circuits 331 to 335) are, for example, low-noise amplifier circuits. Of the five amplifier circuits (the amplifier circuits 331 to 335) included in the radio-frequency front-end circuit 300b, three amplifier circuits (the amplifier circuits 331 to 333) may be integrated into an amplifier circuit 330, and two amplifier circuits (the amplifier circuits 334 and 335) may be integrated into an amplifier circuit 340.

Figure 17:
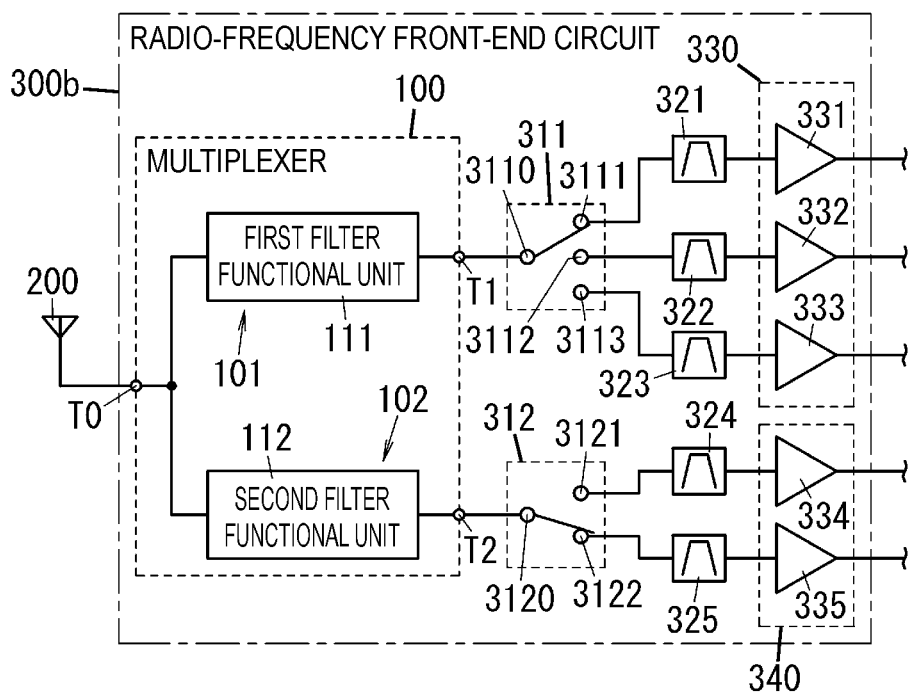
FIG. 17 is a configuration diagram of a modification of a radio-frequency front-end circuit incorporating the multiplexer including the multilayer substrate according to the embodiment.

With the switching circuit 311 and the switching circuit 312 being connected as illustrated in FIG. 17, the radio-frequency front-end circuit 300b can simultaneously use a band belonging to the high-band group (e.g., Band 7) and a band belonging to the low-band group (e.g., Band 3). It is not required that the radio-frequency front-end circuit 300b be configured to support simultaneous use of two LTE bands as mentioned above. For example, the radio-frequency front-end circuit 300b may be configured to support simultaneous use of an LTE band and 5G New Radio (NR) band specified by the fifth generation (5G) standard or may be configured to support simultaneous use of two 5G NR bands. The 5G NR bands are included in UHB (3.3 to 5 GHz).

It is not required that the multilayer substrate 1 include more than one capacitor 5 and more than one input/output electrode 6. The multilayer substrate 1 may include one capacitor 5 and one input/output electrode 6. Each capacitor 5 included in the multilayer substrate 1 is not limited to a series-arm capacitor of a filter and may be a direct-current cutting capacitor or a low-frequency cutting capacitor.

(Conclusion)

As the embodiments described so far, the following aspects are herein disclosed.

In a first aspect, a multilayer substrate (1; 1a; 1b; 1c; 1d) includes a dielectric substrate (2), a pair of capacitor electrodes (3, 4), and an input/output electrode (6) that is an electrode for input, an electrode for output, or an electrode for input and output. The dielectric substrate (2) has a first main surface (21) and a second main surface (22) that are opposite to each other in a thickness direction (D1) of the dielectric substrate (2). The pair of capacitor electrodes (3, 4) is disposed in the dielectric substrate (2). Electrodes of the pair of capacitor electrodes (3, 4) face each other in the thickness direction (D1). The input/output electrode (6) is disposed on the second main surface (22) of the dielectric substrate (2). A capacitor (5) that includes the pair of capacitor electrodes (3, 4) and a portion (25) being part of the dielectric substrate (2) and located between the electrodes of the pair of capacitor electrodes (3, 4) at least partially overlaps the input/output electrode (6) electrically connected to the capacitor (5).

Stray capacitance in the multilayer substrate (1; 1a; 1b; 1c; 1d) according to the first aspect may be suppressed.

In a second aspect, the multilayer substrate (1; 1a; 1b; 1c; 1d) according to the first aspect is configured as follows. The electrodes of the pair of capacitor electrodes (3, 4) are of different sizes when viewed in plan in the thickness direction (D1).

The multilayer substrate (1; 1a; 1b; 1c; 1d) according to the second aspect eliminates or reduces the possibility that the capacitance of the capacitor (5) will deviate from the desired capacitance (design capacitance) due to the misalignment between the electrodes of the pair of capacitor electrodes (3, 4) viewed in plan in the thickness direction (D1) of the dielectric substrate (2).

In a third aspect, the multilayer substrate (1; 1a; 1b; 1c; 1d) according to the first or second aspect further includes a via conductor (7) that forms an electrical connection between the capacitor (5) and the input/output electrode (6). The capacitor (5) and the input/output electrode (6) are electrically connected to each other via only the via conductor (7).

Unwanted capacitance in the multilayer substrate (1; 1a; 1b; 1c; 1d) according to the third aspect may be suppressed.

In a fourth aspect, the multilayer substrate (1c) according to the first or second aspect is configured as follows. The input/output electrode (6) is also used as a capacitor electrode (4) that is one electrode closer than the other electrode of the pair of capacitor electrodes (3, 4) of the capacitor (5) to the second main surface (22).

Unwanted inductance between the input/output electrode (6) and the capacitor (5) in the multilayer substrate (1c) according to the fourth aspect may be suppressed.

In a fifth aspect, the multilayer substrate (1; 1b; 1c; 1d) according to any one of the first to fourth aspects further includes a ground layer (8) that is electrically conductive. The ground layer (8) is closer to the second main surface (22) than to the first main surface (21).

The multilayer substrate (1; 1b; 1c; 1d) according to the fifth aspect is less likely to be affected by factors external to the multilayer substrate (1; 1b; 1c; 1d).

In a sixth aspect, the multilayer substrate (1; 1a; 1b; 1d) according to the fifth aspect is configured as follows. The ground layer (8) is disposed between the capacitor (5) and the second main surface (22) when viewed in the thickness direction (D1).

In the multilayer substrate (1; 1a; 1b; 1d) according to the sixth aspect, stray capacitance between the capacitor (5) and the circuit board (10) may be further suppressed.

In a seventh aspect, the multilayer substrate (1; 1b; 1d) according to the sixth aspect is configured as follows. The ground layer (8) has a first surface (81) and a second surface (82). The first surface (81) is closer than the second surface (82) to the first main surface (21), and the second surface (82) is closer than the first surface (81) to the second main surface (22). A first distance (H1) is greater than a second distance (H2). The first distance (H1) is the distance between a plane (P81) including the first surface (81) of the ground layer (8) and a plane (P52) including a surface (52) closer than another surface of the capacitor (5) to the second main surface (22). The second distance (H2) is the distance between a plane (P82) including the second surface (82) of the ground layer (8) and a plane (P61) including a surface (61) closer than another surface of the input/output electrode (6) to the first main surface (21) of the dielectric substrate (2).

In the multilayer substrate (1; 1b; 1d) according to the seventh aspect, the capacitive coupling between the ground layer (8) and the capacitor (5) may be further suppressed.

In an eighth aspect, the multilayer substrate (1; 1b; 1d) according to the seventh aspect is configured as follows. The ground layer (8) is disposed in a manner so as not to overlap the input/output electrode (6) when viewed in the thickness direction (D1).

In the multilayer substrate (1; 1b; 1d) according to the eighth aspect, stray capacitance between the ground layer (8) and the input/output electrode (6) may be suppressed.

In a ninth aspect, the multilayer substrate (1; 1b; 1c; 1d) according to any one of the fifth to eighth aspects is configured as follows. The ground layer (8) is disposed in a manner so as not to overlap the capacitor (5) when viewed in the thickness direction (D1).

In the multilayer substrate (1; 1b; 1c; 1d) according to the ninth aspect, stray capacitance between the ground layer (8) and the capacitor (5) may be suppressed.

In a tenth aspect, the multilayer substrate (1d) according to the fifth aspect includes a plurality of the input/output electrode (6). The ground layer (8) is disposed on the second main surface (22) of the dielectric substrate (2), and part of the ground layer (8) is located between two adjacent ones of the plurality of input/output electrodes (6).

The multilayer substrate (1d) according to the tenth aspect is much less likely to be affected by the circuit board (10).

In an eleventh aspect, a filter (101 or 102) includes the multilayer substrate (1; 1a; 1b; 1c; 1d) according to any one of the first to tenth aspects. The multilayer substrate (1; 1a; 1b; 1c; 1d) includes a plurality of the input/output electrodes (6) and a plurality of the capacitors (5). The plurality of input/output electrodes (6) include an antenna-side terminal (T0) connected to an antenna (200) and a terminal (a first terminal T1 or a second terminal T2) different from the antenna-side terminal (T0). The plurality of capacitors (5) include a series-arm capacitor (C2 or C12) that is disposed on a path (r11 or r21) forming a connection between the antenna-side terminal (T0) and the terminal (the first terminal T1 or the second terminal T2) and is connected to the terminal (the first terminal T1 or the second terminal T2).

In the filter (101 or 102) according to the eleventh aspect, stray capacitance may be suppressed.

According to a twelfth aspect, a multiplexer (100; 100a) includes the multilayer substrate (1; 1a; 1b; 1c; 1d) according to any one of the first to tenth aspects. The multilayer substrate (1; 1a; 1b; 1c; 1d) includes a plurality of the input/output electrodes (6) and a plurality of the capacitors (5). The plurality of input/output electrodes (6) include: an antenna-side terminal (T0) connected to an antenna (200); and a first terminal (T1) and a second terminal (T2) that are different from the antenna-side terminal (T0). The plurality of capacitors (5) include: a series-arm capacitor (C2) that is disposed on a path (r11) forming a connection between the antenna-side terminal (T0) and the first terminal (T1) and is connected to the first terminal (T1) so as to be part of a first filter (101); and a series-arm capacitor (C12) that is disposed on the path (r21) forming a connection between the antenna-side terminal (T0) and the second terminal (T2) and is connected to the second terminal (T2) so as to be part of a second filter (102).

In the multiplexer (100; 100a) according to the twelfth aspect, stray capacitance may be suppressed.

In a thirteenth aspect, a radio-frequency front-end circuit (300; 300b) includes the multiplexer (100; 100a) according to the twelfth aspect and an amplifier circuit (303; 331, 332, 333, 334, 335) connected to the multiplexer (100; 100a).

In the radio-frequency front-end circuit (300; 300b) according to the thirteenth aspect, stray capacitance may be suppressed.

In a fourteenth aspect, a communication device (400) includes: the radio-frequency front-end circuit (300; 300b) according to the thirteenth aspect; and an RF signal processing circuit (401). The RF signal processing circuit (401) processes radio-frequency signals received through the antenna (200). The radio-frequency front-end circuit (300; 300b) transmits the radio-frequency signals between the antenna (200) and the RF signal processing circuit (401).

In the communication device (400) according to the fourteenth aspect, stray capacitance may be suppressed.

1, 1a, 1b, 1c, 1d multilayer substrate
2 dielectric substrate
21 first main surface
22 second main surface
25 portion
3, 4 capacitor electrode
5 capacitor
52 surface
6 input/output electrode
60 ground electrode
61 surface
600 control electrode
7, 71, 72 via conductor
8 ground layer
81 first surface
82 second surface
100, 100a multiplexer
101 filter (first filter)
102 filter (second filter)
200 antenna
300, 300b radio-frequency front-end circuit
303 amplifier circuit (first amplifier circuit)
321, 322, 323, 324, 325 filter
331, 332, 333, 334, 335 amplifier circuit
400 communication device
401 RF signal processing circuit
C2, C12 series-arm capacitor
D1 thickness direction
H1 first distance
H2 second distance
P52, P61, P81, P82 plane
r11 path (first series-arm path)
r21 path (second series-arm path)
T0 antenna-side terminal
T1 first terminal
T2 second terminal

The invention claimed is:

1. A multilayer substrate comprising:
a dielectric substrate having a first main surface and a second main surface that are opposite to each other in a thickness direction of the dielectric substrate;
a pair of capacitor electrodes in the dielectric substrate, the pair of capacitor electrodes facing each other in the thickness direction;
an input/output electrode that is configured to receive an input signal, to output an output signal, or to receive the input signal and to output the output signal, the input/output electrode being on the second main surface of the dielectric substrate; and
a ground layer that is electrically conductive and that is closer to the second main surface than to the first main surface,
wherein a capacitor at least partially overlaps the input/output electrode, the capacitor comprising the pair of capacitor electrodes and a portion of the dielectric substrate between the pair of capacitor electrodes,
wherein the input/output electrode is electrically connected to the capacitor, and
wherein the ground layer does not overlap the capacitor in the thickness direction.

2. The multilayer substrate according to claim 1, wherein, as seen in a plan view of the dielectric substrate along the thickness direction, each electrode of the pair of capacitor electrodes is a different size.

3. The multilayer substrate according to claim 1, further comprising a via conductor connecting the capacitor and the input/output electrode, the capacitor and the input/output electrode being electrically connected to each other only by the via conductor.

4. The multilayer substrate according to claim 1, wherein the input/output electrode is also the capacitor electrode of the pair of capacitor electrodes that is closest to the second main surface.

5. The multilayer substrate according to claim 1, wherein the ground layer is between the capacitor and the second main surface in the thickness direction.

6. The multilayer substrate according to claim 5, wherein:
the ground layer has a first surface and a second surface, the first surface being closer to the first main surface than the second surface, and the second surface being closer to the second main surface than the first surface, and
a first distance is greater than a second distance, the first distance being a distance between a plane including the first surface of the ground layer and a plane including a surface closer to the second main surface than a surface of the capacitor, and the second distance being a distance between a plane including the second surface of the ground layer and a plane including a surface closer to the first main surface than a surface of the input/output electrode.

7. The multilayer substrate according to claim 6, wherein the ground layer does not overlap the input/output electrode in the thickness direction.

8. The multilayer substrate according to claim 1, wherein:
the multilayer substrate comprises a plurality of the input/output electrodes,
the ground layer is on the second main surface of the dielectric substrate, and
a portion of the ground layer is between two adjacent ones of the plurality of input/output electrodes.

9. A filter, comprising:
a multilayer substrate comprising:
a dielectric substrate having a first main surface and a second main surface that are opposite to each other in a thickness direction of the dielectric substrate;
a plurality of pairs of capacitor electrodes in the dielectric substrate, each pair of capacitor electrodes facing each other in the thickness direction; and
a plurality of input/output electrodes that are each configured to receive an input signal, to output an output signal, or to receive the input signal and to output the output signal, each of the input/output electrodes being on the second main surface of the dielectric substrate, wherein each one of a plurality of capacitors at least partially overlaps a respective one of the input/output electrodes, each one of the plurality of capacitors comprising a respective one of the pairs of capacitor electrodes and a portion of the dielectric substrate between the respective one of the pairs of capacitor electrodes, wherein each input/output electrode is electrically connected to the respective one of the capacitors, wherein the plurality of input/output electrodes comprise: an antenna-side terminal connected to an antenna, and a terminal different from the antenna-side terminal, wherein the plurality of capacitors comprise a series-arm capacitor that is on a path connecting the antenna-side terminal and the terminal, and wherein the series-arm capacitor is connected to the terminal.

10. A multiplexer, comprising:
a multilayer substrate comprising:
    a dielectric substrate having a first main surface and a second main surface that are opposite to each other in a thickness direction of the dielectric substrate;
    a plurality of pairs of capacitor electrodes in the dielectric substrate, each pair of capacitor electrodes facing each other in the thickness direction; and
    a plurality of input/output electrodes that are each configured to receive an input signal, to output an output signal, or to receive the input signal and to output the output signal, each of the input/output electrodes being on the second main surface of the dielectric substrate, wherein each one of a plurality of capacitors at least partially overlaps a respective one of the input/output electrodes, each one of the plurality of capacitors comprising a respective one of the pairs of capacitor electrodes and a portion of the dielectric substrate between the respective one of the pairs of capacitor electrodes, wherein each input/output electrode is electrically connected to the respective one of the capacitors, wherein the plurality of input/output electrodes comprise: an antenna-side terminal connected to an antenna, and a first terminal and a second terminal that are different from the antenna-side terminal, and wherein the plurality of capacitors comprise:
    a first series-arm capacitor that is on a path connecting the antenna-side terminal and the first terminal, the first series-arm capacitor being connected to the first terminal and part of a first filter, and
    a second series-arm capacitor that is on a path connecting the antenna-side terminal and the second terminal, the second series-arm circuit being connected to the second terminal and part of a second filter.

11. A radio-frequency front-end circuit, comprising:
the multiplexer according to claim 10; and
an amplifier circuit connected to the multiplexer.

12. A communication device, comprising:
the radio-frequency front-end circuit according to claim 11; and
a radio frequency (RF) signal processing circuit configured to process radio-frequency signals received through the antenna,
wherein the radio-frequency front-end circuit is configured to transmit the radio-frequency signals between the antenna and the RF signal processing circuit.

* * * * *